(12) United States Patent
Kawata et al.

(10) Patent No.: US 10,914,996 B2
(45) Date of Patent: Feb. 9, 2021

(54) ELECTRO-OPTICAL DEVICE AND ELECTRONIC APPARATUS

(71) Applicant: SEIKO EPSON CORPORATION, Tokyo (JP)

(72) Inventors: Hidenori Kawata, Chino (JP); Mitsutaka Ohori, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/594,220

(22) Filed: Oct. 7, 2019

(65) Prior Publication Data
US 2020/0110319 A1  Apr. 9, 2020

(30) Foreign Application Priority Data
Oct. 8, 2018  (JP) .................. 2018-190542

(51) Int. Cl.
| | |
|---|---|
| *G02F 1/1362* | (2006.01) |
| *H01L 27/12* | (2006.01) |
| *G02F 1/1368* | (2006.01) |
| *H01L 29/78* | (2006.01) |

(52) U.S. Cl.
CPC ...... *G02F 1/136209* (2013.01); *G02F 1/1368* (2013.01); *G02F 1/136286* (2013.01); *H01L 27/124* (2013.01); *H01L 27/1248* (2013.01); *H01L 29/7833* (2013.01); *G02F 1/136213* (2013.01)

(58) Field of Classification Search
CPC .................................................... H01L 27/124
See application file for complete search history.

(56) References Cited

U.S. PATENT DOCUMENTS

| | | | |
|---|---|---|---|
| 6,078,366 A | * | 6/2000 | Dohjo ............... G02F 1/1345 349/43 |
| 2002/0014627 A1 | | 2/2002 | Sato |
| 2003/0025848 A1 | | 2/2003 | Sera et al. |
| 2004/0008295 A1 | | 1/2004 | Ueda et al. |
| 2004/0149989 A1 | | 8/2004 | Matsunaga et al. |
| 2004/0257489 A1 | | 12/2004 | Gotoh et al. |

FOREIGN PATENT DOCUMENTS

| | | |
|---|---|---|
| JP | 2002-108248 A | 4/2002 |
| JP | 2003-131261 A | 5/2003 |
| JP | 2004-045576 A | 2/2004 |
| JP | 2004-151546 A | 5/2004 |
| JP | 2004-235557 A | 8/2004 |
| JP | 2005-159115 A | 6/2005 |
| JP | 2008-241974 A | 10/2008 |
| JP | 2009-186929 A | 8/2009 |

* cited by examiner

*Primary Examiner* — William A Harriston
(74) *Attorney, Agent, or Firm* — Oliff PLC

(57) ABSTRACT

A liquid crystal apparatus as an electro-optical device includes a base material as a substrate, a TFT as a transistor, a second scanning line having a light shielding property in a layer between a semiconductor layer of the TFT and the base material, and a light shielding layer disposed between the second scanning line and an adjacent second scanning line adjacent to the second scanning line so as to overlap each of an end portion of the one second scanning line and an end portion of the adjacent second scanning line, in plan view from a normal line direction on one surface of the substrate.

10 Claims, 20 Drawing Sheets

ELECTRO-OPTICAL DEVICE AND ELECTRONIC APPARATUS

The present application is based on, and claims priority from JP Application Serial Number 2018-190542, filed Oct. 8, 2018, the disclosure of which is hereby incorporated by reference herein in its entirety.

BACKGROUND

1. Technical Field

The present disclosure relates to an electro-optical device, and an electronic apparatus.

2. Related Art

In the past, as one type of electro-optical device, an active drive type liquid crystal apparatus including a transistor having a Lightly Doped Drain (LDD) structure as a switching element in a pixel electrode has been known. Additionally, when a liquid crystal apparatus is used in a liquid crystal light valve such as a projector, incident light on the liquid crystal apparatus increases in comparison to a liquid crystal apparatus of a direct view type. Thus, in the transistor described above, an off-leak current is likely to increase due to stray light, derived from an indirect route of the incident light (diffracted light), reflection, or the like. The increase in the off-leak current contributes to a display failure such as pixel unevenness of the liquid crystal apparatus. Thus, there is a need for a light shielding structure that reduces diffracted light and the like.

For example, Japanese Unexamined Patent Application Publication No. 2005-159115 discloses a thin film transistor array substrate including a first rear surface light-shielding film and a second rear surface light-shielding film that has an opening portion between a glass substrate and a polycrystalline silicon layer. Additionally, for example, Japanese Unexamined Patent Application Publication No. 2008-241974 discloses an electro-optical device including a third light-shielding film made of an identical layer to an upper capacitance electrode formed so as to cover the space between a scanning line and the first light-shielding film, in a dummy pixel area of a Thin Film Transistor (TFT) array substrate.

However, in the light-shielding film described in Japanese Unexamined Patent Application Publication No. 2005-159115 and Japanese Unexamined Patent Application Publication No. 2008-241974, there was a problem in that incident light took a roundabout route to propagate to a semiconductor layer of the transistor in some cases. Specifically, light easily took a roundabout route to the semiconductor layer from a gap between one gate line (scanning line) and another gate line (scanning line) adjacent to each other. In particular, when light took a roundabout route from a side of the TFT array substrate of the liquid crystal apparatus, it was difficult to reduce diffracted light propagating to the semiconductor layer. In other words, there was a demand for an electro-optical device to improve a light shielding property for a semiconductor layer of a transistor.

SUMMARY

An electro-optical device according to the present application includes a substrate, a transistor, a scanning line in a layer between a semiconductor layer of the transistor and the substrate, the scanning line having a light shielding property, and a light shielding layer disposed between one scanning line and an adjacent scanning line adjacent to the one scanning line so as to overlap each of an end portion of the one scanning line and an end portion of the adjacent scanning line, in plan view from a normal line direction on one surface of the substrate.

The above electro-optical device preferably includes an interlayer insulating layer in a layer between a light shielding layer and a scanning line.

The above electro-optical device preferably includes a light absorption layer in a layer between a light shielding layer and an interlayer insulating layer.

In the electro-optical device described above, a light absorption layer preferably includes a forming material having a refractive index of from 1.5 to 4.0 and an extinction coefficient of from 0.0 to 2.0 relative to light having a wavelength of 550 nm.

In the electro-optical device described above, a light shielding layer preferably does not overlap a channel area and an LDD area of the semiconductor layer, in plan view from a normal line direction on one surface of a substrate.

In the electro-optical device described above, it is preferable that a recessed portion provided on one surface of a substrate be included, a recessed portion be provided in a gap between the scanning line and another scanning line adjacent to each other in plan view from a normal line direction on one surface of a substrate, and at least a part of a light shielding layer be provided within a recessed portion.

In the electro-optical device described above, a height from a bottom surface of a recessed portion to one surface of a substrate is preferably greater than a thickness of a light shielding layer.

In the electro-optical device described above, it is preferable that a recessed portion provided on one surface of a substrate be included, and a height from a bottom surface of a recessed portion to one surface of a substrate be greater than a total value of a thickness of a light absorption layer and a thickness of an interlayer insulating layer.

An electronic apparatus according to the present application includes the above-described electro-optical device.

DESCRIPTION OF EXEMPLARY EMBODIMENTS

Exemplary embodiments of the present disclosure will be described below with reference to the accompanying drawings. The embodiments described below describe examples of the present disclosure. The present disclosure is not limited to the embodiments below, and various modifications that are implemented in a range that does not alter the gist of the present disclosure are also included in the present disclosure.

Note that, in each of the drawings below, to make each layer and each member a recognizable size, each of the layers and each of the members are illustrated to be different from an actual scale and an actual angle. Furthermore, in descriptions below, for example, for a substrate, a description of "on the substrate", refers to any one of a case where an object is disposed on and in contact with the substrate, a case where an object is disposed above the substrate with another structure interposed, and a case where a portion of an object is disposed on and in contact with the substrate, and another portion of the object is disposed with another structure interposed.

Exemplary Embodiment 1

In the present exemplary embodiment, descriptions will be given by illustrating, as an electro-optical device, an active drive type liquid crystal apparatus including a Thin Film Transistor (hereinafter referred to as a TFT) as a transistor for each pixel. This liquid crystal apparatus can be used suitably as, for example, a liquid crystal light valve (light modulation element) of a projection-type display device (liquid crystal projector) as an electronic apparatus described later. Note that, the electro-optical device of the present disclosure is not limited to the above.

Configuration of Liquid Crystal Apparatus

Figure 1:
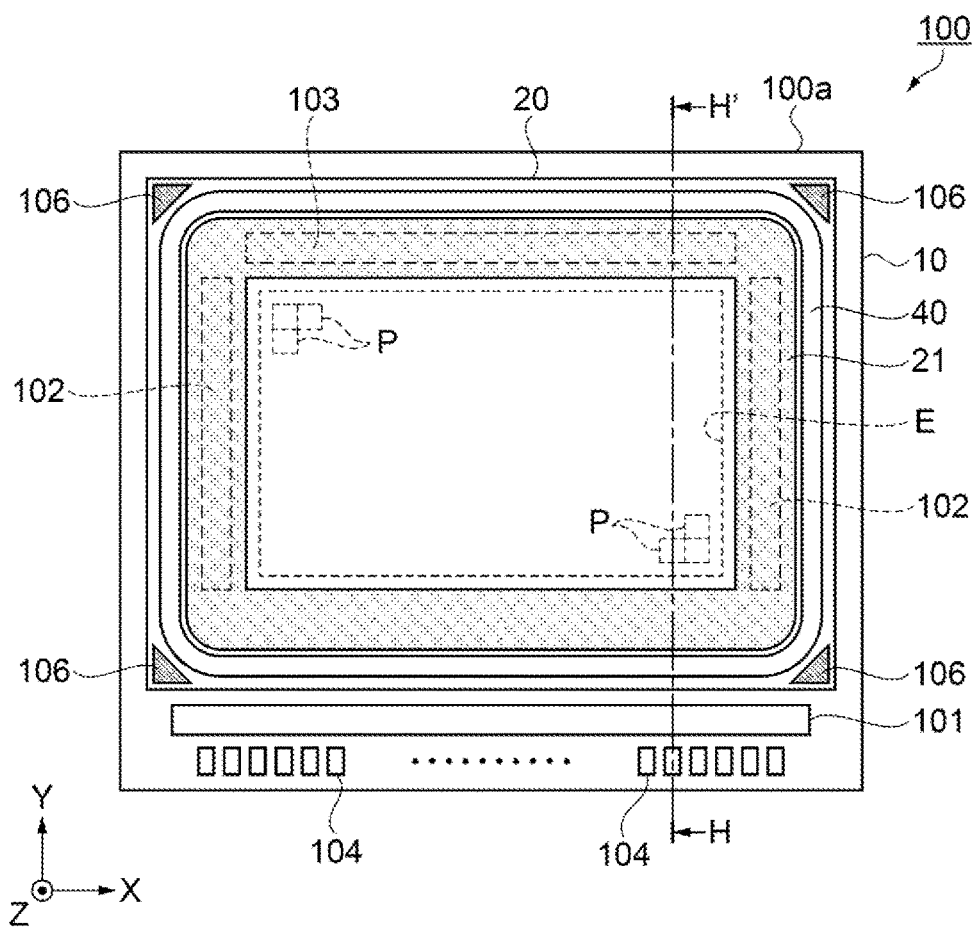
FIG. 1 is a schematic plan view illustrating a configuration of a liquid crystal apparatus as an electro-optical device according to Exemplary Embodiment 1.
Figure 2:
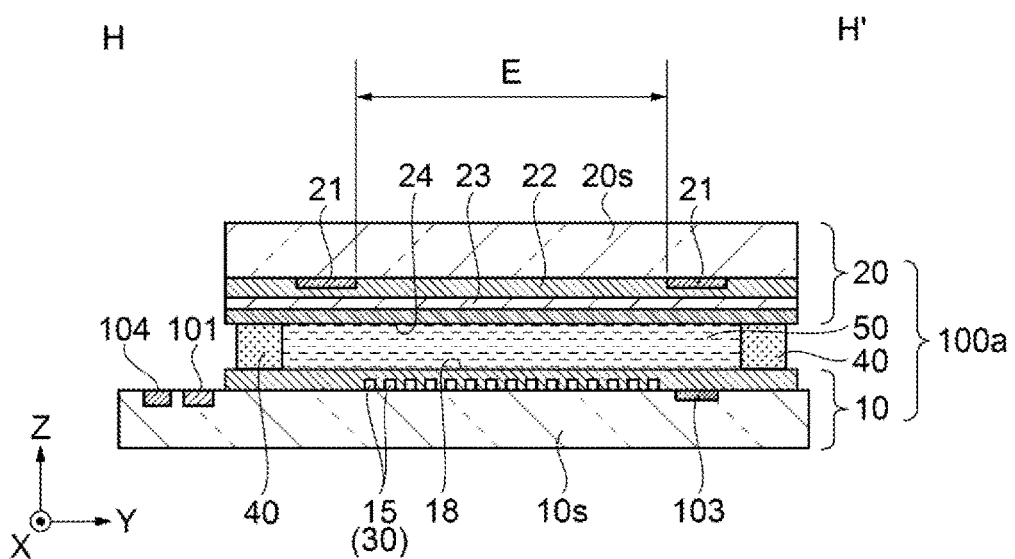
FIG. 2 is a schematic cross-sectional view illustrating a structure of the liquid crystal apparatus taken along a line H-H' in FIG. 1.
Figure 3:
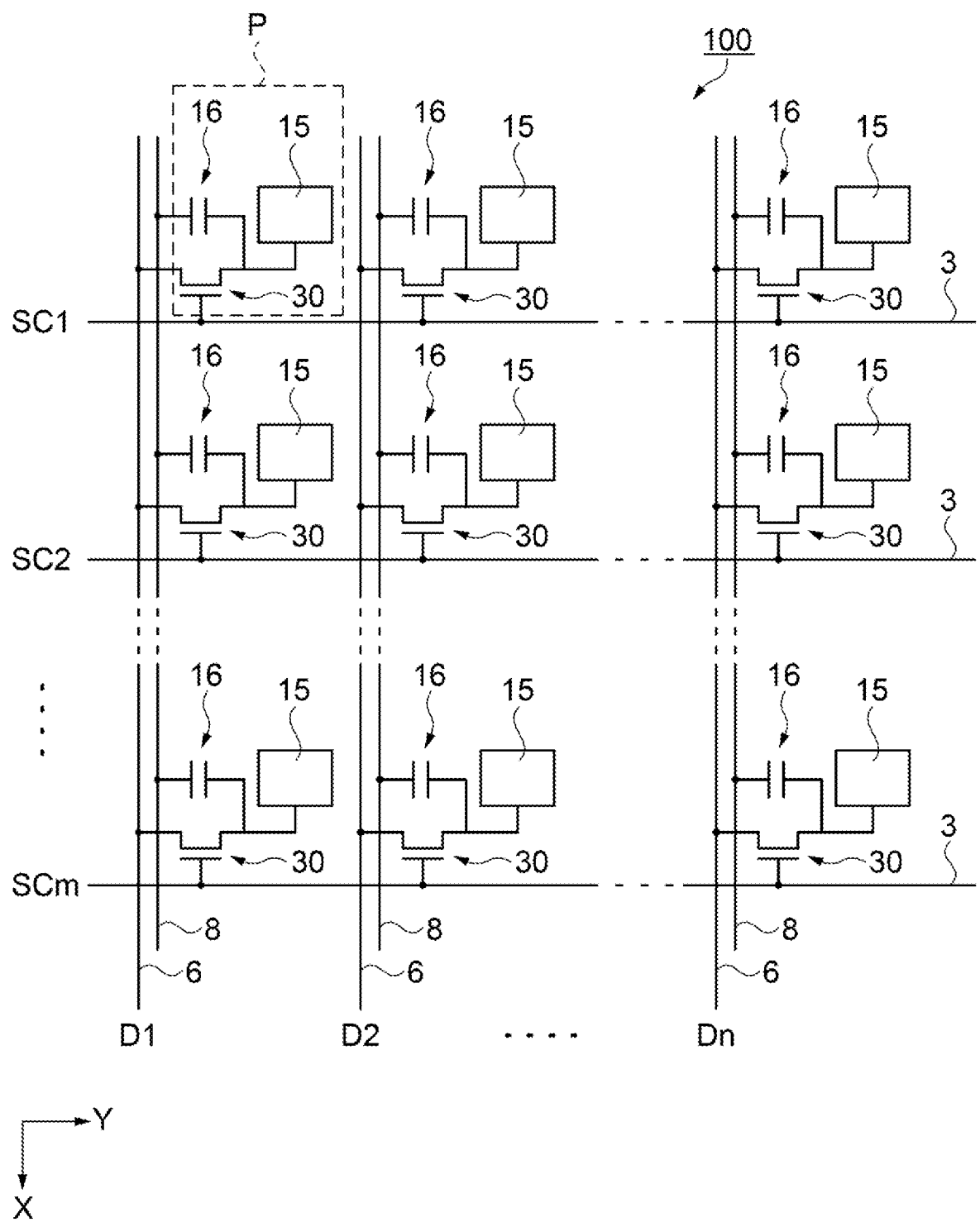
FIG. 3 is an equivalent circuit diagram illustrating an electrical configuration of the liquid crystal apparatus.

A configuration of a liquid crystal apparatus according to the present exemplary embodiment will be described with reference to FIG. 1 to FIG. 3. FIG. 1 is a schematic plan view illustrating a configuration of the liquid crystal apparatus as an electro-optical device according to Exemplary Embodiment 1. FIG. 2 is a schematic cross-sectional view illustrating structure of the liquid crystal apparatus taken along a line H-H' in FIG. 1. FIG. 3 is an equivalent circuit diagram illustrating an electrical configuration of the liquid crystal apparatus.

As illustrated in FIG. 1 and FIG. 2, a liquid crystal apparatus 100 in the present exemplary embodiment includes a liquid crystal panel 100a, and the liquid crystal panel 100a includes an element substrate 10, a counter substrate 20, and a liquid crystal layer 50. The counter substrate 20 is disposed opposing the element substrate 10. The liquid crystal layer 50 is sandwiched between the element substrate 10 and the counter substrate 20 (hereinafter, also referred to as a "pair of substrates" in some cases). Light emitted from a light source is incident from a side of the element substrate 10 and emitted from a side of the counter substrate 20. For example, a quartz substrate or a glass substrate having optical transparency is used for each of a base material 10s of the element substrate 10 and a base material 20s of the counter substrate 20. The base material 10s of the element substrate 10 is an example of the substrate in the present disclosure. Note that, it is also possible to adopt a configuration in which light emitted from a light source is incident from the side of the counter substrate 20 and emitted from the side of the element substrate 10.

The element substrate 10 is greater than the counter substrate 20. The pair of substrates is bonded together at an interval with a seal portion 40 disposed along an outer edge of the counter substrate 20 interposed therebetween. A liquid crystal having positive or negative dielectric anisotropy is encapsulated in an area surrounded by the pair of substrates and the seal portion 40 to form the liquid crystal layer 50.

For the seal portion 40, for example, an adhesive such as a thermosetting or ultraviolet curable epoxy resin is adopted. The seal portion 40 is mixed with a spacer (not illustrated) for keeping an interval between the pair of substrates constant.

A display area E in which a plurality of pixels P is arrayed in a matrix pattern is provided inside the seal portion 40. A partition portion 21 is provided surrounding the display area E, between the seal portion 40 and the display area E. Here, the display area E may include, in addition to the pixels P that are effective and contribute to displaying the liquid crystal apparatus 100, a plurality of dummy pixels (not illustrated) surrounding the pixel P that does not contribute to the displaying.

The partition portion 21 is made of, for example, metal or a metal compound having a light shielding property. The partition portion 21 surrounds the display area E, and is provided at a position where the partition portion 21 planarly overlaps a scanning line drive circuit 102 and an inspection circuit 103. Thus, a function for shielding light mainly incident on these circuits from the side of the counter substrate 20, and preventing a malfunction from occurring is included. Further, the partition portion 21 prevents unnecessary stray light from entering the display area E, and secures high contrast in displaying in the display area E.

Here, in the present exemplary embodiment, an ultraviolet curable epoxy resin is adopted for a forming material of the seal portion 40. Thus, in consideration of the curability of the seal portion 40 by ultraviolet in a manufacturing process of the liquid crystal panel 100a, positional precision in bonding the pair of substrates, and the like, a gap is provided between the partition portion 21 and the seal portion 40, such that the partition portion 21 and the seal portion 40 are arranged so as not to overlap each other (see FIG. 1).

The element substrate 10 is provided with a terminal portion in which a plurality of external connection terminals 104 is arrayed. A data line drive circuit 101 is provided between a first side portion along the terminal portion and the seal portion 40. In addition, the inspection circuit 103 is provided between the seal portion 40 along a second side portion opposing the first side portion, and the display area E.

The scanning line drive circuit 102 is provided between the seal portion 40 orthogonal to the first side portion and along a third side portion and a fourth side portion opposing each other, and the display area E. Further, between the seal portion 40 on the second side portion and the inspection circuit 103, a plurality of wiring lines (not illustrated) is provided that links the two scanning line drive circuits 102.

The wiring lines (not illustrated) linked to the data line drive circuit 101 and the scanning line drive circuit 102 are coupled with the plurality of external connection terminals 104 arrayed along the first side portion. Note that, the arrangement of the inspection circuit 103 is not limited thereto, and the inspection circuit 103 may be provided between the seal portion 40 along the data line drive circuit 101 and the display area E.

Here, in the present specification, a direction along the first side portion is referred to as an X direction, and a direction orthogonal to the first side portion and along the third side portion and the fourth side portion opposing each other is referred to as a Y direction. In addition, a direction orthogonal to the X direction and the Y direction, and facing from the element substrate 10 toward the counter substrate 20 is referred to as a positive Z direction, and viewing from the positive Z direction is referred to as "in plan view" or "planarly". Furthermore, a side of the positive Z direction is referred to as an upside, and a direction opposite to the upper side is referred to as a downside (side of a negative Z direction). Note that, the Z direction is synonymous with a normal line direction of the liquid crystal panel 100*a*.

As illustrated in FIG. 2, a pixel electrode 15 having optical transparency provided for each of the pixels P, a TFT 30 being a switching element of the pixel electrode 15, a signal wiring line, and an alignment film 18 covering these components are provided on a surface of the base material 10*s* on a side of the liquid crystal layer 50. The element substrate 10 includes the base material 10*s*, and the pixel electrode 15, the TFT 30, the signal wiring line, and the alignment film 18 that are provided on the base material 10*s*. A detailed configuration of the element substrate 10 will be described later.

The counter substrate 20 is disposed opposing the element substrate 10. The counter substrate 20 includes the base material 20*s*, the partition portion 21, a planarization layer 22, a counter electrode 23, and an alignment film 24. In the counter substrate 20, the partition portion 21 is provided on the base material 20*s*, and the planarization layer 22 is formed as a film covering the partition portion 21. Furthermore, the counter electrode 23 is provided covering the planarization layer 22, and the alignment film 24 is provided covering the counter electrode 23. The counter electrode 23 is provided at least across the display area E in the base material 20*s*, and functions as a common electrode.

The planarization layer 22 is made of, for example, an inorganic material such as silicon oxide having optical transparency. As a formation method of the planarization layer 22, for example, a film formation method using a plasma Chemical Vapor Deposition (CVD) method or the like may be cited.

The counter electrode 23 is formed of, for example, a transparent conductive film, such as Indium Tin Oxide (ITO). The counter electrode 23 covers the planarization layer 22, and is electrically coupled to vertical conducting portions 106 provided on four corners of the counter substrate 20 (see FIG. 1). The vertical conducting portion 106 is electrically coupled to the external connection terminal 104 via a wiring line on a side of the element substrate 10.

The alignment film 18 covering the pixel electrode 15 and the alignment film 24 covering the counter electrode 23 are selected based on an optical design of the liquid crystal apparatus 100. Specifically, as the alignment films 18 and 24, an inorganic alignment film obtained by forming an inorganic material such as silicon oxide as a film by a vapor growth method and by aligning almost vertically with respect to liquid crystal molecules having negative dielectric anisotropy may be cited. Furthermore, as the alignment films 18 and 24, for example, an organic alignment film obtained by forming an organic material such as polyimide as a film, performing a rubbing process on a surface thereof, and performing an almost horizontal alignment process on liquid crystal molecules having positive dielectric anisotropy may be cited.

The above-described liquid crystal apparatus 100 is of a transmissive-type and, an optical design in a normally white mode in which transmittance of the pixel P is maximized under a state where a voltage is not applied, or in a normally black mode in which the transmittance of the pixel P is minimized under the state where a voltage is not applied is adopted. A polarizing element (not illustrated) is disposed, on each of a light incidence side and a light exit side of the liquid crystal panel 100*a* including the element substrate 10 and the counter substrate 20, in accordance with the optical design.

In the present exemplary embodiment, an embodiment will be described, in which the optical design of the normally black mode is applied, in which the above-described inorganic alignment films as the alignment films 18 and 24, and a liquid crystal (liquid crystal molecule) having negative dielectric anisotropy are adopted.

Next, an electrical configuration of the liquid crystal apparatus 100 (the liquid crystal panel 100*a*) will be described with reference to FIG. 3. As illustrated in FIG. 3, the liquid crystal apparatus 100 includes, as signal wiring lines insulated from one another and orthogonal to one another at least in the display area E, a plurality of scanning lines 3, a plurality of data lines 6 and a plurality of common potential lines 8 disposed in parallel with the data line 6. A direction in which the scanning line 3 extends is the Y direction, and a direction in which the data line 6 extends is the X direction. Note that, in FIG. 3, the common potential line 8 is illustrated as extending along the X direction, but is not limited thereto.

The scanning line 3, the data line 6, and the common potential line 8 are provided, and in an area partitioned by these signal lines, the pixel electrode 15, the TFT 30, and a capacitance element 16 are provided, and these components constitute a pixel circuit of the pixel P. The pixel electrode 15, the TFT 30, and the capacitance element 16 are disposed for each of the pixels P.

The scanning line 3 is electrically coupled to a gate of the TFT 30, and the data line 6 is electrically coupled to a data line side source drain area (source area) of the TFT 30. The scanning line 3 has a function to simultaneously control ON and OFF of the TFTs 30 provided in an identical row. The pixel electrode 15 is electrically coupled to a pixel electrode side source drain area (drain area) of the TFT 30.

The data lines 6 are electrically coupled to the data line drive circuit 101 (see FIG. 1), and supply image signals D1, D2, . . . , and Dn supplied from the data line drive circuit 101 to the pixels P. The scanning lines 3 are electrically coupled to the scanning line drive circuit 102 (see FIG. 1), and supply scanning signals SC1, SC2, . . . , and SCm supplied from the scanning line drive circuit 102 to each of the pixels P.

The image signal D1 to the image signal Dn supplied from the data line drive circuit 101 to the data lines 6 may be line-sequentially supplied in this order, or may be supplied to the plurality of data lines 6 adjacent to each other, for each group. The scanning line drive circuit 102 line-sequentially supplies the scanning signal SC1 to the scanning signal SCm to the scanning lines 3 in a pulsed manner at predetermined timing.

In the liquid crystal apparatus 100, the TFT 30 as a switching element is turned to be ON state only for a certain period by an input of the scan signal SC1 to the scan signal SCm. Accordingly, the image signal D1 to the image signal Dn supplied from the data lines 6 are written to the pixel electrodes 15 at a predetermined timing. Additionally, the image signal D1 to the image signal Dn, having a predetermined level written into the liquid crystal layer 50 via the pixel electrodes 15, are held for a certain period between the pixel electrodes 15 and the counter electrode 23, that are disposed opposing the pixel electrodes 15 with the liquid crystal layer 50 interposed therebetween.

To prevent the image signal D1 to the image signal Dn held from leaking, the capacitance element 16 is coupled in parallel with a liquid crystal capacitor formed between the pixel electrode 15 and the counter electrode 23. The capacitance element 16 is provided between the drain area of the TFT 30 and the common potential line 8.

Here, although not illustrated in FIG. 3, the data line 6 is coupled with the inspection circuit 103 (see FIG. 1). Thus, in a manufacturing process of the liquid crystal apparatus 100, it is possible, by detecting the above-described image signals, to verify operational defects and the like of the liquid crystal apparatus 100.

In addition, the inspection circuit 103 may include a sampling circuit that samples the image signals described above and supplies the image signals to the data lines 6, and a pre-charge circuit that supplies pre-charge signals at a predetermined voltage level to the data lines 6 in advance to the supply of the image signals.

Figure 4A:
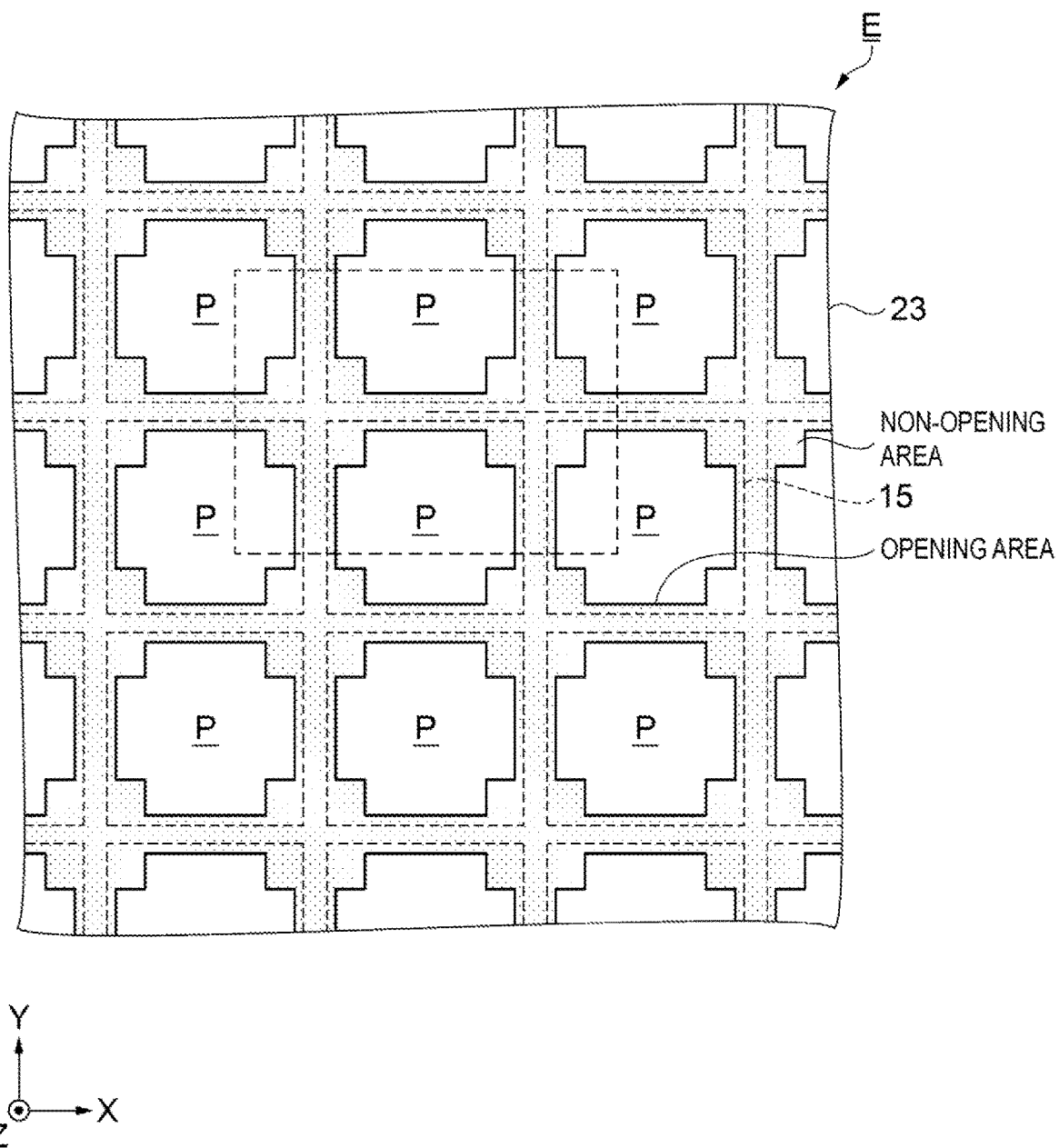
FIG. 4A is a schematic plan view illustrating an arrangement of pixels.
Figure 4B:
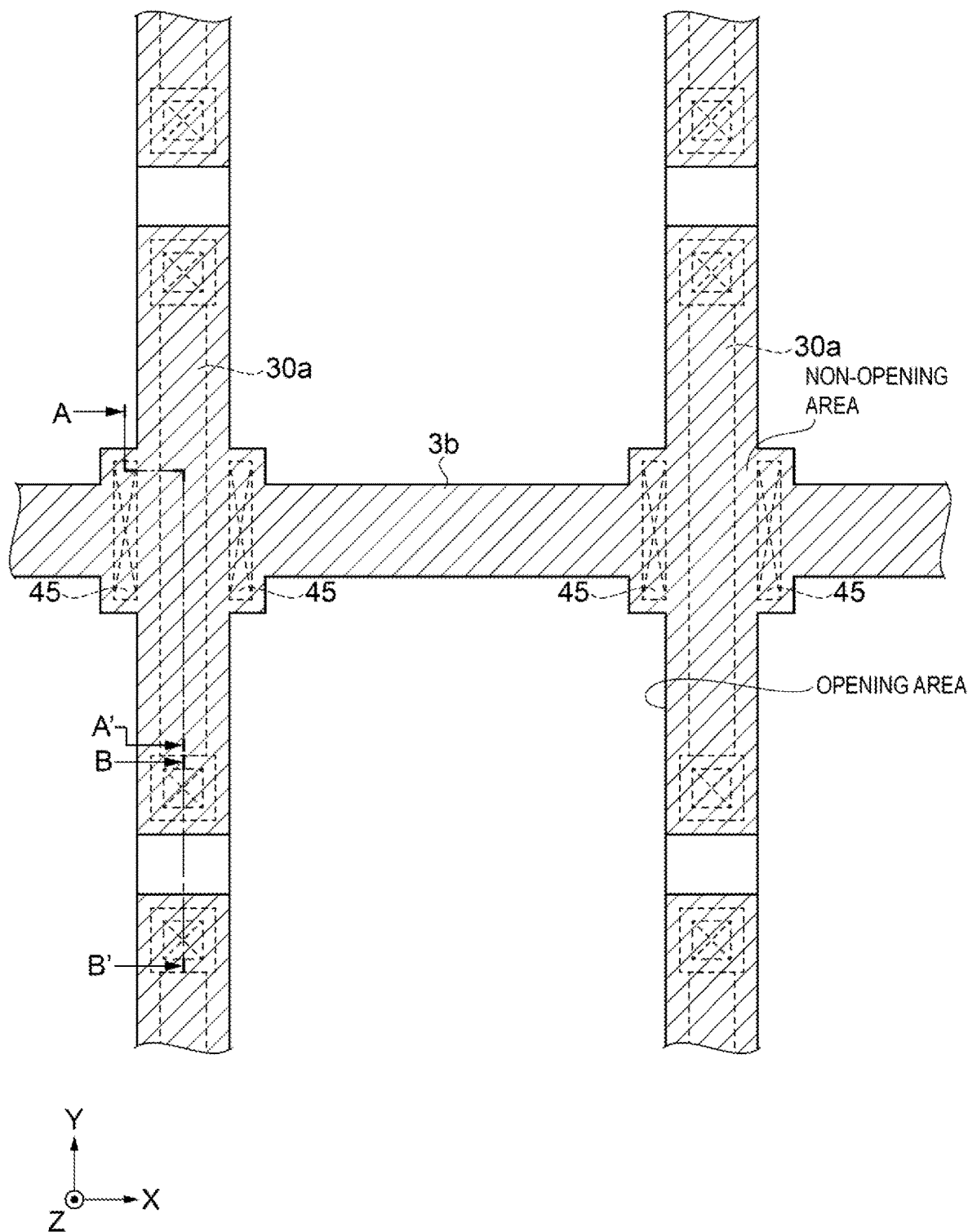
FIG. 4B is an enlarged plan view illustrating an arrangement of a semiconductor layer and the like in an element substrate.

Next, a configuration of the pixel P and the like in the liquid crystal apparatus 100 will be described with reference to FIG. 4A and FIG. 4B. FIG. 4A is a schematic plan view illustrating arrangement of the pixels. FIG. 4B is an enlarged plan view illustrating an arrangement of a semiconductor layer and the like on an element substrate. Note that, in FIG. 4B, an area denoted by a dashed line in FIG. 4A is enlarged, and a second scanning line 3b, a semiconductor layer 30a, a contact hole 45, and the like, described later, are denoted by dashed lines.

As illustrated in FIG. 4A, the pixel P in the liquid crystal apparatus 100 includes, for example, an opening area having a substantially rectangular shape (substantially square shape) in plan view. The opening area is surrounded by a non-opening area extending in the X direction, and a non-opening area extending in the Y direction. The non-opening areas have a light shielding property and are provided in a lattice-like manner in plan view.

In the non-opening area extending in the X direction, the data line 6 (see FIG. 3) is provided. A conductive member having a light shielding property is used for the data line 6. Thus, part of the non-opening area is configured with the data line 6.

In the non-opening area extending in the Y direction, the scanning line 3 (see FIG. 3) and the like are provided. For the scanning line 3, a conductive member having a light shielding property is used. Thus, part of the non-opening area is configured with the scanning line 3.

In addition to the above-described wiring lines and the like provided on the side of the element substrate 10, the non-opening area is also configured with a pattern in a lattice-like manner provided on an identical layer to the partition portion 21 on the side of the counter substrate 20.

The pixel electrode 15 is provided for each of the pixels P on the element substrate 10. The pixel electrode 15 has a substantially square shape in plan view. The pixel electrode 15 is provided in the opening area such that an outer edge thereof overlaps the non-opening area. Note that, although not illustrated in FIG. 4A, the capacitance element 16 having a light shielding property is also disposed in the opening area.

As illustrated in FIG. 4B, the semiconductor layer 30a of the TFT 30 is provided on the element substrate 10, near an intersection of the X direction and the Y direction in the non-opening area. The semiconductor layer 30a has a substantially rectangular shape that is elongated in the Y direction in plan view, and is provided along the non-opening area extending in the Y direction. A pair of contact holes 45 is provided in an area on which the non-opening area extending in the X direction and the non-opening area extending in the Y direction intersect (hereinafter, also referred to as an "intersection portion of the non-opening areas") sandwiching the semiconductor layer 30a in the X direction.

The semiconductor layer 30a is provided near the intersection portion of the non-opening areas having a light shielding property. Thus, an opening ratio in the opening area is secured. In order to provide the semiconductor layer 30a and the contact hole 45 near the intersection portion of the non-opening areas, respective widths in the X direction and the Y direction of the non-opening area near the intersection portion of the non-opening areas are set to be greater than those of other portions.

A gap is provided between the second scanning lines 3b adjacent to each other in the Y direction. The gap will be described later.

The liquid crystal apparatus 100 of the present exemplary embodiment is of the transmissive-type as described above, and is based on an assumption that light is incident from the side of the element substrate 10. Thus, the element substrate 10 (liquid crystal apparatus 100) includes light shielding structure (light shielding layer) that shields not only light directly incident on the TFT 30, but also diffracted light, reflected light, and the like. Hereinafter, together with a configuration of the element substrate 10, the light shielding structure will be described. Note that, a direction of light incident on the liquid crystal apparatus 100 is not limited to a direction from the side of the element substrate 10, but may be a direction from the side of the counter substrate 20. In addition, the liquid crystal apparatus 100 may have a configuration in which a focusing means such as a microlens that focuses incident light for each of the pixels P is provided on a substrate on a side on which light is incident.

Configuration of Element Substrate

Figure 5:
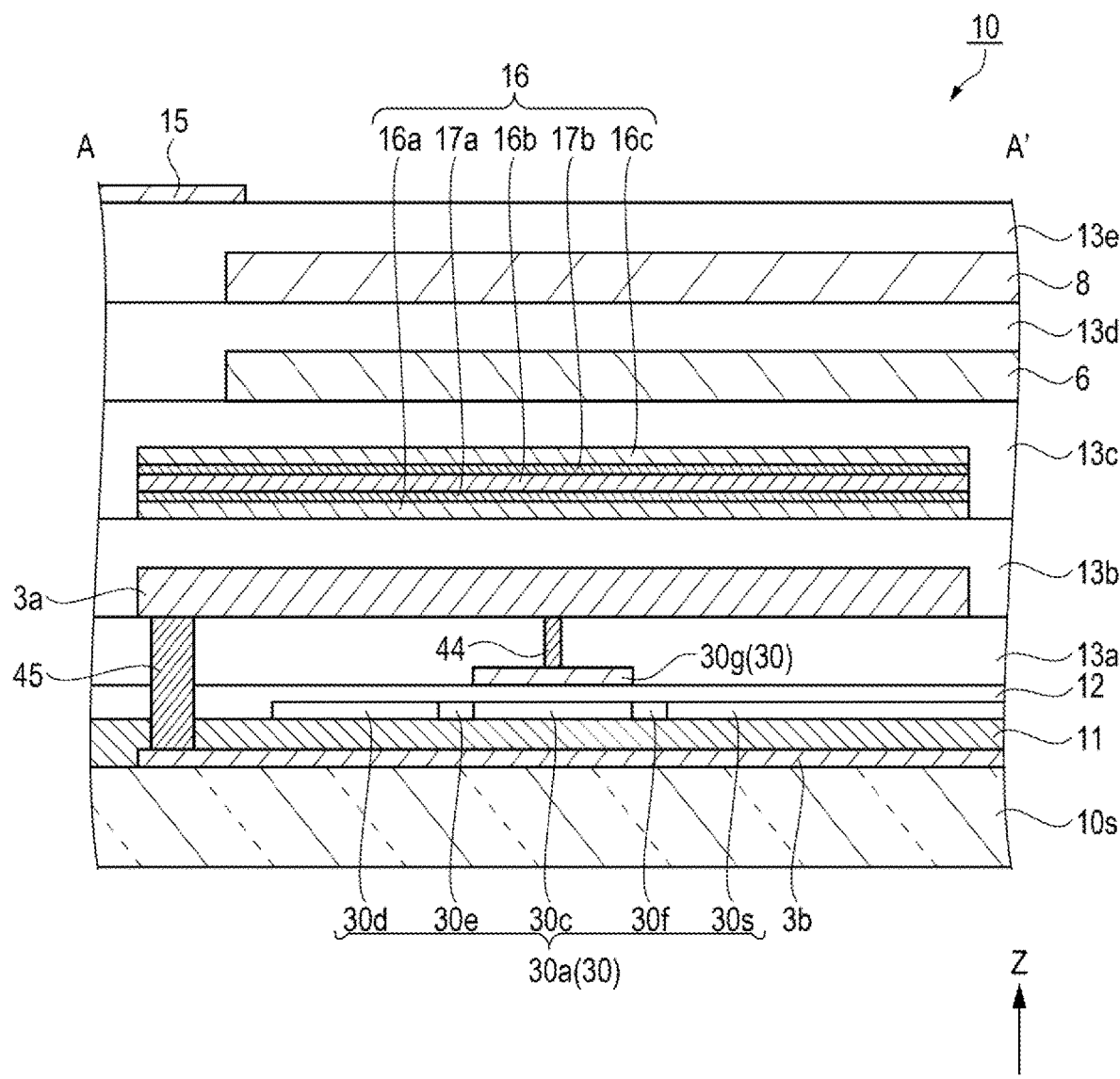
FIG. 5 is a schematic cross-sectional view illustrating a structure of the element substrate taken along a line A-A' in FIG. 4B.

A layer configuration of the element substrate 10 constituting the liquid crystal apparatus 100 will be described with reference to FIG. 5. FIG. 5 is a schematic cross-sectional view illustrating structure of the element substrate taken along the line A-A' in FIG. 4B. The line A-A' is a line segment that traverses the TFT 30 and the like. Note that, FIG. 5 illustrates a cross-sectional and positional relationship of respective components, and is represented in a scale that can be explicitly illustrated. Further, in FIG. 5, an illustration of the alignment film 18 is omitted.

As illustrated in FIG. 5, the element substrate 10 (liquid crystal apparatus 100) includes the base material 10s as a substrate, the TFT 30, a first scanning line 3a, and the second scanning line 3b. The TFT 30 includes the semiconductor layer 30a and a gate electrode 30g. Each of the first scanning line 3a and the second scanning line 3b has a light shielding property. The second scanning line 3b is provided between the semiconductor layer 30a of the TFT 30 and the base material 10s. Here, the scanning line 3 (see FIG. 3) described above is constituted by the first scanning line 3a and the second scanning line 3b. The first scanning line 3a is electrically coupled to the gate electrode 30g via a contact hole 44. A plurality of layers is provided on the base material 10s. Here, in the present exemplary embodiment, an embodiment in which the gate electrode 30g and the first scanning line 3a are separate wiring lines is exemplified, but is not limited thereto. The element substrate 10 may be an embodiment in which the gate electrode 30g and the first scanning line 3a are commonalized, and the first scanning line serves as the gate electrode.

The plurality of layers provided on the element substrate 10 includes, from a side of the base material 10s (from a bottom) in order, a first layer including the second scanning line 3b, a second layer including the semiconductor layer 30a, a third layer including the gate electrode 30g, a fourth layer including the first scanning line 3a, a fifth layer including the capacitance element 16, a sixth layer including the data line 6, a seventh layer including the common potential line 8, and an eighth layer including the pixel electrode 15.

Each of a base insulating layer 11 between the first and second layers, a gate insulating layer 12 between the second and third layers, a first interlayer insulating layer 13a between the third and fourth layers, a second interlayer insulating layer 13b between the fourth and fifth layers, a third interlayer insulating layer 13c between the fifth and sixth layers, a fourth interlayer insulating layer 13d between the sixth and seventh layers, and a fifth interlayer insulating layer 13e between the seventh and eighth layers is provided. This prevents occurrence of a short circuit between each of the layers.

The second scanning line 3b is provided in the first layer on the base material 10s. As a forming material of the second scanning line 3b, a single layer or a plurality of layers of metal alone, alloy, metal silicide, polysilicide, a silicon film such as conductive polysilicon or amorphous silicon, or the like that has a light shielding property and includes, for example, one or more kinds of high melting point metal such as titanium (Ti), chromium (Cr), tungsten (W), tantalum (Ta), molybdenum (Mo), and the like may be cited. The second scanning line 3b has a function to shield light incident on the semiconductor layer 30a mainly from below (the side on the base material 10s). In the present exemplary embodiment, the second scanning line 3b is patterned and formed by a photolithography method using tungsten silicide. A thickness (distance in the Z direction) of the second scanning line 3b is not particularly limited, but is approximately 200 nm, for example.

The base insulating layer 11 and a light shielding layer (not illustrated) described later are provided between the second scanning line 3b and the second layer. The base insulating layer 11 has a function to insulate the second scanning line 3b from the TFT 30. In addition, the base insulating layer 11 is formed almost on an entire surface of the base material 10s, and thus has a function of preventing roughness at the time of surface polishing of the base material 10s and changes in characteristics of the TFT 30 due to contamination or the like remaining after cleaning.

The base insulating layer 11 is formed, for example, by using silicon oxide (Non-doped Silicate Glass: NSG) or silicon nitride. As a method of forming the base insulating layer 11, an atmospheric pressure CVD method, a low-pressure CVD method, or a plasma CVD method using a processing gas such as monosilane ($SiH_4$), dichlorosilane ($SiCl_2H_2$), Tetraethyl Orthosilicate (TEOS), and ammonia may be cited. The base insulating layer 11 will be described in detail later.

The TFT 30 is disposed in the second layer and the third layer on the first layer. The TFT 30 includes the semiconductor layer 30a provided in the second layer, and the gate electrode 30g provided in the third layer. A Lightly Doped Drain (LDD) structure is formed in the semiconductor layer 30a of the TFT 30.

The semiconductor layer 30a is provided so as to extend in the Y direction (see FIG. 4B) in the second layer. The semiconductor layer 30a is formed of a polysilicon film obtained by crystallizing an amorphous silicon film deposited by, for example, a low-pressure CVD method. To do so, crystallization is performed by performing high-temperature treatment at 1000° C. or more, on the above amorphous silicon film, for example. Impurity ions are selectively injected into the polysilicon film to form a channel area 30c, high concentration impurity areas 30d, 30s, and, as connection layers (LDD areas), low concentration impurity areas 30e and 30f.

By forming the LDD area having high electrical resistance in the semiconductor layer 30a so as to sandwich the channel area 30c, a leakage current during off time is suppressed. In terms of leakage current suppression during off time, it is sufficient to adopt a configuration in which the LDD area is included in a joining section between the high concentration impurity area 30d and the channel area 30c to which the capacitance element 16 and the pixel electrode 15 are electrically coupled. A thickness of the semiconductor layer 30a is not particularly limited, but is approximately 50 nm, for example.

The gate insulating layer 12 is provided covering the semiconductor layer 30a. The gate insulating layer 12 is provided between the semiconductor layer 30a and the gate electrode 30g, and insulates the semiconductor layer 30a from the gate electrode 30g. The gate insulating layer 12 has dual structure including, for example, a first silicon oxide film obtained by thermally oxidizing a semiconductor film of silicon, and a second silicon oxide film formed under a high-temperature condition at 700° C. to 900° C. by using a low-pressure CVD method. A thickness of the gate insulating layer 12 is not particularly limited, but is approximately 80 nm, for example.

The gate electrode 30g is provided in the third layer opposing the channel area 30c in the Z direction. The gate electrode 30g is formed, for example, by using conductive polysilicon, metal silicide, metal, a metal compound, or the like. In the present exemplary embodiment, the gate electrode 30g has two-layered structure including a conductive polysilicon film and a tungsten silicide film. The conductive polysilicon film is formed, by depositing a polysilicon film doped with phosphorus (P) by a low-pressure CVD method, and subsequently performing phosphorus diffusion treatment, such that phosphorus atoms at concentration of $1\times10^{19}$ pieces/cm$^3$ or greater are contained in the polysilicon film. A thickness of the gate electrode 30g is not particularly limited, but is approximately 150 nm, for example.

Here, in the present exemplary embodiment, hereinafter, the conductive polysilicon film refers to a polysilicon film that is doped with phosphorous atoms and provided with electrical conductivity, as described above. Note that, atoms to be doped are not limited to phosphorus atoms.

The first interlayer insulating layer 13a is provided above the gate electrode 30g so as to cover the gate electrode 30g. The first interlayer insulating layer 13a is formed, for example, by using one or more kinds of silicon-based oxide films such as an NSG film, a Phosphosilicate Glass (PSG) film containing phosphorus (P), a Borosilicate Glass (BSG) film containing boron, and a Borophosphosilicate Glass (BPSG) film containing boron (B) and phosphorus (P).

As a method for forming the above silicon-based oxide films, an atmospheric pressure CVD method, a low-pressure CVD method, or a plasma CVD method using monosilane, dichlorosilane, TEOS, Triethyl Borate (TEB), or the like may be cited. Note that, since a surface of the first interlayer insulating layer 13a is covered with the TFT 30 including the gate electrode 30g and unevenness occurs thereon, planarization treatment such as chemical and mechanical treatment (Chemical & Mechanical Polishing: CMP treatment) is applied that mitigates the above unevenness in consideration of a patterning property of electrodes or wiring lines formed subsequently. A thickness of the first interlayer insulating layer 13a after the planarization treatment is not particularly limited, but is approximately 200 nm, for example.

The contact holes 44, 45 and the like are provided in the first interlayer insulating layer 13a. The contact hole 44 penetrates the first interlayer insulating layer 13a, and electrically couples the gate electrode 30g and the first scanning line 3a. The contact hole 45 penetrates the base insulating layer 11 through the first interlayer insulating layer 13a, and electrically couples the first scanning line 3a and the second scanning line 3b.

Here, although not illustrated in FIG. 5, a contact hole that is electrically coupled to a capacitance intermediate electrode 16b of the capacitance element 16 described later is provided in the high concentration impurity area 30d of the semiconductor layer 30a. Note that, the above contact hole, the contact holes 44, 45, and the like are formed, for example, after an interlayer insulating layer is subjected to dry-etching to provide a through-hole, so as to fill the through-hole together with a conductive layer (signal wiring line) electrically coupled in upper layers. Further, a contact hole is provided that penetrates the gate insulating layer 12 and the first interlayer insulating layer 13a, and is electrically coupled to the high concentration impurity area 30s of the semiconductor layer 30a. The above contact hole is electrically coupled to an upper contact hole and the data line 6, via a relay layer provided in an identical layer to the first scanning line 3a.

The first scanning line 3a is provided in the fourth layer on the first interlayer insulating layer 13a. The contact hole 45 described above is electrically coupled to the first scanning line 3a. Thus, the first scanning line 3a is electrically coupled to the gate electrode 30g and the second scanning line 3b.

A forming material of the first scanning line 3a is not particularly limited, as long as the forming material is a conductive low-resistance wiring material, and examples thereof include metal such as aluminum (Al) and titanium (Ti), and metal compounds thereof, for example. In the present exemplary embodiment, the first scanning line 3a has a four-layered structure including a titanium (Ti) layer/a titanium nitride (TiN) layer/an aluminum (Al) layer/a titanium nitride (TiN) layer. A thickness of the first scanning line 3a is not particularly limited, but is approximately 250 nm, for example.

The second interlayer insulating layer 13b is provided covering the first scanning line 3a. As a forming material of the second interlayer insulating layer 13b, a silicon-based oxide film similar to that of the first interlayer insulating layer 13a may be cited. In the present exemplary embodiment, silicon oxide is adopted for the second interlayer insulating layer 13b. In the second interlayer insulating layer 13b, unevenness is likely to occur on a surface after film formation due to a wiring structure of lower layers. Thus, the second interlayer insulating layer 13b after the film formation is subjected to planarization treatment such as CMP processing, for example. A thickness of the second interlayer insulating layer 13b after the planarization treatment is not particularly limited, but is approximately 300 nm.

The capacitance element 16 is provided in the fifth layer on the second interlayer insulating layer 13b. In the capacitance element 16, from a side of the base material 10s in a lower layer toward an upper layer (Z direction) in order, a capacitance lower electrode 16a, a dielectric layer 17a, the capacitance intermediate electrode 16b, a dielectric layer 17b, and a capacitance upper electrode 16c are stacked. The capacitance element 16 includes a first capacitance element configured with the capacitance lower electrode 16a, the dielectric layer 17a, and the capacitance intermediate electrode 16b, and a second capacitance element configured with the capacitance intermediate electrode 16b, the dielectric layer 17b, and the capacitance upper electrode 16c.

The capacitance element 16 has a function to improve a potential retention property in the pixel electrode 15. The capacitance element 16 is provided so as to fit in the non-opening area (see FIG. 4A) in plan view.

The capacitance lower electrode 16a is formed on the second interlayer insulating layer 13b, for example, after a conductive film such as titanium nitride is formed, by patterning the conductive film. A thickness of the capacitance lower electrode 16a is not particularly limited, but is 50 nm, for example.

The dielectric layer 17a is provided on the capacitance lower electrode 16a so as to cover the capacitance lower electrode 16a. The dielectric layer 17a is formed of a plurality of layers formed using dielectric materials each having different dielectric constants. As the dielectric materials, for example, hafnium oxide, aluminum oxide, silicon oxide, silicon nitride, tantalum oxide, and the like, may be cited, and these are used in combination. By combining the plurality of layers each having the different dielectric constants, larger electrical capacitance can be secured compared to that of a single layer.

For the dielectric layer 17a of the present exemplary embodiment, a multilayer film is adopted in which hafnium oxide having a high dielectric constant and aluminum oxide having excellent pressure resistance are stacked in this order. A thickness of the dielectric layer 17a is not particularly limited, but is 25 nm, for example. Note that, part of the capacitance lower electrode 16a is not covered by the dielectric layer 17a, 17b and the capacitance intermediate electrode 16b on upper layers, and is electrically coupled to the capacitance upper electrode 16c via a connecting portion. Furthermore, the capacitance upper electrode 16c is electrically coupled to the common potential line 8 in the seventh layer via a contact hole.

The capacitance intermediate electrode 16b is provided on the dielectric layer 17a so as to cover the dielectric layer 17a. Similar to the capacitance lower electrode 16a, the capacitance intermediate electrode 16b is formed by forming a conductive film such as titanium nitride, and then patterning the conductive film. As described above, the capacitance intermediate electrode 16b is electrically coupled to the high concentration impurity area 30d of the semiconductor layer 30a via a contact hole (not illustrated). A thickness of the capacitance intermediate electrode 16b is not particularly limited, but is 50 nm, for example.

The dielectric layer 17b is provided on the capacitance intermediate electrode 16b so as to cover the capacitance intermediate electrode 16b. A forming material similar to that of the dielectric layer 17a can be adopted for the dielectric layer 17b. In the dielectric layer 17b of the present exemplary embodiment, similar to the dielectric layer 17a, a multilayer film including a hafnium oxide layer and an aluminum oxide layer is adopted. A thickness of the dielectric layer 17b is not particularly limited, but is 25 nm, for example. Note that, part of the capacitance intermediate electrode 16b is not covered by the dielectric layer 17b and the capacitance upper electrode 16c on upper layers, and is electrically coupled to the pixel electrode 15 via a contact hole.

The capacitance upper electrode 16c is provided on the dielectric layer 17b so as to cover the dielectric layer 17b. Similar to the capacitance lower electrode 16a, the capacitance upper electrode 16c is formed by forming a conductive film such as titanium nitride, and then patterning the conductive film. A thickness of the capacitance upper electrode 16c is not particularly limited, but is 100 nm, for example.

The third interlayer insulating layer 13c is provided covering the capacitance element 16. As a forming material of the third interlayer insulating layer 13c, for example, a silicon-based oxide film similar to that of the first interlayer insulating layer 13a may be cited. In the present exemplary embodiment, silicon oxide is adopted for the third interlayer insulating layer 13c. In the third interlayer insulating layer 13c, unevenness is likely to occur on a surface after film formation due to the capacitance element 16 and the like on lower layers. Thus, the third interlayer insulating layer 13c after the film formation is subjected to planarization treatment such as CMP processing, for example. A thickness of the third interlayer insulating layer 13c after the planarization treatment is not particularly limited, but is approximately 400 nm, for example.

The data line 6 is provided in the sixth layer on the third interlayer insulating layer 13c. The data line 6 extends in the Y direction in the non-opening area of the pixel P (see FIG. 4A). As described above, the data line 6 is electrically coupled to the high concentration impurity area 30s of the semiconductor layer 30a, via a contact hole (not illustrated) or the like.

A forming material of the data line 6 is not particularly limited, as long as the forming material is a conductive low-resistance wiring material, and examples thereof include metal such as aluminum (Al) and titanium (Ti), and metal compounds thereof. In the present exemplary embodiment, the data line 6 has a four-layered structure including a titanium (Ti) layer/a titanium nitride (TiN) layer/an aluminum (Al) layer/a titanium nitride (TiN) layer. A thickness of the data line 6 is not particularly limited, but is approximately 350 nm, for example.

The fourth interlayer insulating layer 13d is provided covering the data line 6. As a forming material of the fourth interlayer insulating layer 13d, a silicon-based oxide film similar to that of the first interlayer insulating layer 13a may be cited. In the present exemplary embodiment, silicon oxide is adopted for the fourth interlayer insulating layer 13d. In the fourth interlayer insulating layer 13d, unevenness is likely to occur on a surface after film formation due to a wiring structure of lower layers. Thus, for example, planarization treatment such as CMP processing is performed. A thickness of the fourth interlayer insulating layer 13d after the planarization treatment is not particularly limited, but is approximately 400 nm, for example.

The common potential line 8 is provided in the seventh layer on the fourth interlayer insulating layer 13d. In plan view, the common potential line 8 is provided overlapping the data line 6 extending in the X direction and the scanning line 3 (the first scanning line 3a, the second scanning line 3b) extending in the Y direction. The common potential line 8, although not illustrated, is electrically coupled to the vertical conducting portion 106 of the counter substrate 20. Accordingly, identical potential to common potential provided for the counter electrode 23 is provided for the common potential line 8. Accordingly, influence of potential of the data line 6 or the scanning line 3 is suppressed from reaching the pixel electrode 15, by the common potential line 8.

A forming material of the common potential line 8, similar to the data line 6, is not particularly limited, as long as the forming material is a conductive low-resistance wiring material, and examples thereof include metal such as aluminum (Al) and titanium (Ti), and metal compounds thereof. In the present exemplary embodiment, the common potential line 8 has a four-layered structure including a titanium (Ti) layer/a titanium nitride (TiN) layer/an aluminum (Al) layer/a titanium nitride (TiN) layer. A thickness of the common potential line 8 is not particularly limited, but is approximately 250 nm, for example.

The fifth interlayer insulating layer 13e is provided covering the common potential line 8. As a forming material of the fifth interlayer insulating layer 13e, for example, a silicon-based oxide film similar to that of the first interlayer insulating layer 13a may be cited. In the present exemplary embodiment, silicon oxide is adopted for the fifth interlayer insulating layer 13e. In the fifth interlayer insulating layer 13e, unevenness is likely to occur on a surface after film formation due to a wiring structure of lower layers. Thus, the fifth interlayer insulating layer 13e after the film formation is subjected to planarization treatment such as CMP processing, for example. A thickness of the fifth interlayer insulating layer 13e after the planarization treatment is not particularly limited, but is approximately 300 nm.

The pixel electrode 15 is provided in the eighth layer on the fifth interlayer insulating layer 13e. The pixel electrode 15 is formed by forming a transparent conductive film such as ITO or Indium Zinc Oxide (IZO), for example, and then patterning. In the present exemplary embodiment, ITO is adopted for the pixel electrode 15. The pixel electrode 15 is electrically coupled to the capacitance intermediate electrode 16b via a contact hole and the like. A thickness of the pixel electrode 15 is not particularly limited, but is approximately 145 nm, for example.

Note that, the alignment film 18 (see FIG. 2) is provided covering the pixel electrode 15. In the present exemplary embodiment, for the alignment film 18 of the element substrate 10 and the alignment film 24 of the counter substrate 20 (see FIG. 2), the inorganic alignment film is adopted as described above. The above inorganic alignment film is formed of an aggregate of columns grown in a columnar shape by depositing an inorganic material such as silicon oxide from a predetermined direction (for example, in an oblique direction).

Liquid crystal molecules included in the liquid crystal layer 50 (see FIG. 2) have negative dielectric anisotropy with respect to the alignment films 18 and 24. Thus, the above liquid crystal molecules have a pretilt angle θp of 3° to 5° in an inclination direction of a column with respect to a normal line direction of an alignment film surface and are substantially aligned vertically (VA: Vertical Alignment). By applying an alternating voltage (drive signal, alternating current signal) between the pixel electrode 15 and the counter electrode 23 (see FIG. 2) to drive the liquid crystal layer 50, the liquid crystal molecules behave (vibrate) to tilt in a direction generated by the electric field between the pixel electrode 15 and the counter electrode 23. In the present exemplary embodiment, a nematic liquid crystal in which a nematic-isotropic phase transition temperature (Tni) is 110° C. is used as a liquid crystal having negative dielectric anisotropy.

Light Shielding Structure of Element Substrate

Figure 6:
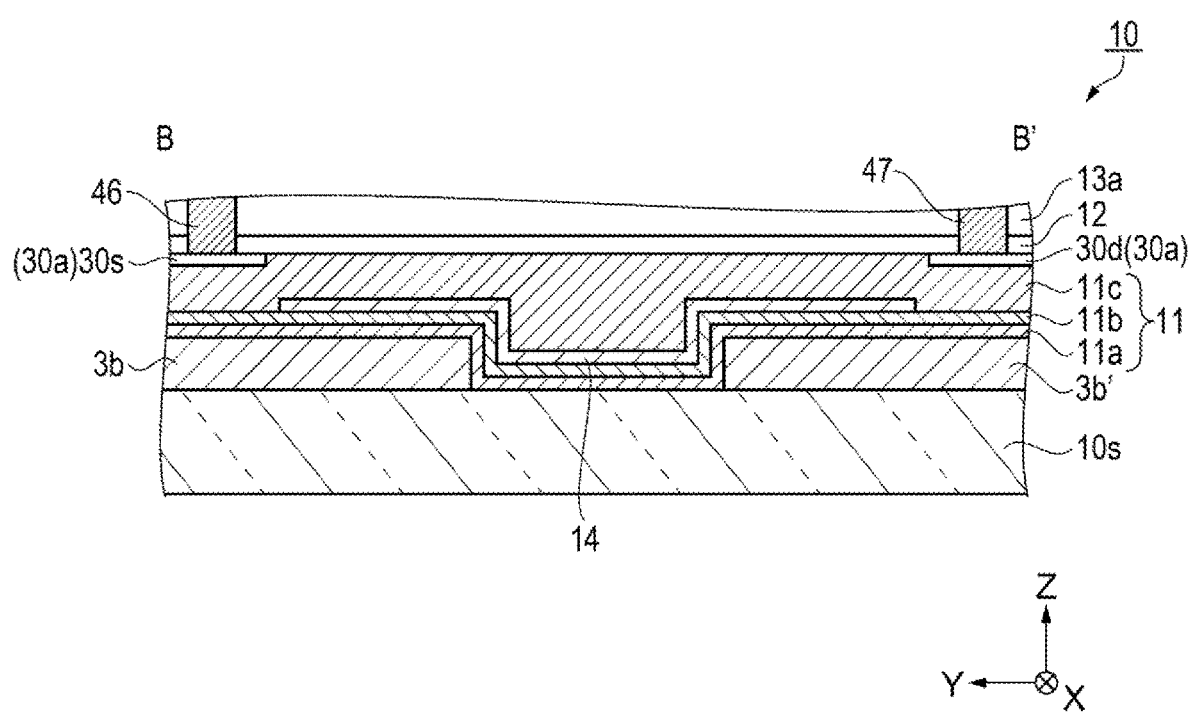
FIG. 6 is an enlarged cross-sectional view illustrating the structure of the element substrate taken along a line B-B' in FIG. 4B.

First, a light shielding structure of the element substrate 10 according to the present exemplary embodiment will be described with reference to FIG. 6. FIG. 6 is an enlarged cross-sectional view illustrating the structure of the element substrate taken along the line B-B' in FIG. 4B. The line B-B' is a line segment that traverses the semiconductor layer 30a, a gap between the second scanning line 3b and the second scanning line 3b' adjacent to each other in the Y direction, and the like. Note that, in FIG. 6, an illustration of the fourth layer and higher is omitted.

As illustrated in FIG. 6, a light shielding layer 14 is provided in the base insulating layer 11 as a layer between the semiconductor layer 30a and each of the second scanning lines 3b and 3b', so as to cover a gap between the second scanning line 3b and the second scanning line 3b' adjacent to the second scanning line 3b. In other words, in plan view from a normal line direction (positive Z direction) on one surface of the base material 10s, the light shielding layer 14 is provided so as to overlap each of an end portion of the second scanning line 3b and an end portion of the second scanning line 3b', between the second scanning line 3b and the adjacent second scanning line 3b'. Note that, the light shielding layer 14 is an example of the light shielding layer (light shielding structure) of the present disclosure, and the second scanning lines 3b and 3b' are examples of the scanning line of the present disclosure.

The second scanning line 3b disposed on the base material 10s, and the second scanning line 3b' adjacent to the second scanning line 3b in the Y direction, are disposed with a gap. A distance of the gap between the second scanning line 3b and the second scanning line 3b' in the Y direction is not particularly limited, but is approximately 1.0 μm, for example.

The base insulating layer 11 is provided covering the above gap. The base insulating layer 11 is configured with a first base insulating layer 11a, a second base insulating layer 11b, and a third base insulating layer 11c. The first base insulating layer 11a is provided covering an upside of each of the second scanning line 3b and the second scanning line 3b', and an upside of the base material 10s in the gap. The second base insulating layer 11b is provided covering an upside of the first base insulating layer 11a. The light shielding layer 14 is provided above the second base insulating layer 11b so as to cover the above gap. The first base insulating layer 11a and the second base insulating layer 11b prevent a short circuit between the light shielding layer 14 and each of the second scanning lines 3b and 3b'.

The light shielding layer 14 extends in the positive and negative Y directions, and covers, in addition to the gap described above, an end portion of the second scanning line 3b on a side of the above gap and an end portion of the second scanning line 3b' on a side of the above gap. Accordingly, light incident from a side of the base material 10s can be suppressed from taking a roundabout route from the gap between the second scanning line 3b and the second scanning line 3b', becoming diffracted light, and entering the semiconductor layer 30a. The light shielding layer 14 does not extend up to a downside of the semiconductor layer 30a (high concentration impurity areas 30d and 30s). Thus, unevenness that occurs above the light shielding layer 14 is less likely to reach the semiconductor layer 30a.

The third base insulating layer 11c is provided covering an upside of the light shielding layer 14, and an upside of the second base insulating layer 11b not covered with the light shielding layer 14.

Here, in the present exemplary embodiment, the light shielding layer 14 is an embodiment that does not extend up to a downside of the semiconductor layer 30a, but is not limited thereto. The light shielding layer 14 may extend up to a downside of each of the high concentration impurity areas 30d and 30s, as long as the light shielding layer 14 does not overlap each of the channel area 30c and the LDD area (the low concentration impurity areas 30e and 30f) in the semiconductor layer 30a.

In the present exemplary embodiment, silicon oxide is used as a forming material of the base insulating layer 11. Specifically, each of the first base insulating layer 11a and the third base insulating layer 11c is formed of a Tetraethyl Orthosilicate (TEOS) film. The second base insulating layer 11b is formed of a High Temperature Oxide (HTO) film. The TEOS film has high film formability and can be formed with a good coating state even with a relatively large film thickness, and has a sufficient insulating property. The HTO film has excellent cracking resistance, and also functions as a gas barrier layer for the semiconductor layer 30a (TFT 30). The TEOS film may be substituted with a silicate glass other than TEOS or silicon oxide.

A thickness of the base insulating layer 11 is not particularly limited, but a thickness of each of the first base insulating layer 11a and the second base insulating layer 11b is approximately 50 nm, and a thickness of the third base insulating layer 11c is approximately 200 nm, for example.

As a forming material of the light shielding layer 14, a single layer or a plurality of layers of metal alone, alloy, metal silicide, polysilicide, a silicon film such as conductive polysilicon or amorphous silicon, or the like that has a light shielding property and includes, for example, one or more kinds of high melting point metals such as titanium (Ti), chromium (Cr), tungsten (W), tantalum (Ta), molybdenum (Mo), and the like may be cited.

In the present exemplary embodiment, for example, for the light shielding layer 14, tungsten silicide having a light shielding property equivalent to that of the second scanning lines 3b, 3b', or the like (thickness of approximately 200 nm or greater) is adopted. In detail, when a thickness (distance in the Z direction) of the second scanning lines 3b and 3b' is large, in a gap between the second scanning line 3b and the second scanning line 3b' in the Y direction, there is a possibility that a deposition property of the light shielding layer 14 is reduced during film formation, and a thickness of the light shielding layer 14 may be reduced. Thus, when the forming material of the light shielding layer 14 is similar to that of the second scanning lines 3b and 3b', the light shielding layer 14 is preferably formed relatively thick so as to have a thickness substantially equivalent to that of the second scanning lines 3b and 3b'. A known method can be adopted to form the light shielding layer 14, and patterning using, for example, a photolithography method is employed.

The semiconductor layer 30a is provided above the third base insulating layer 11c (base insulating layer 11). The gate insulating layer 12 is provided covering the semiconductor layer 30a and the base insulating layer 11, and further, the first interlayer insulating layer 13a is provided covering the gate insulating layer 12. A contact hole 46 that electrically couples the high concentration impurity area 30d of the semiconductor layer 30a and an upper signal wiring line, and a contact hole 47 that electrically couples the high concentration impurity area 30s of the semiconductor layer 30a and an upper signal wiring line are provided in the first interlayer insulating layer 13a.

Figure 7:
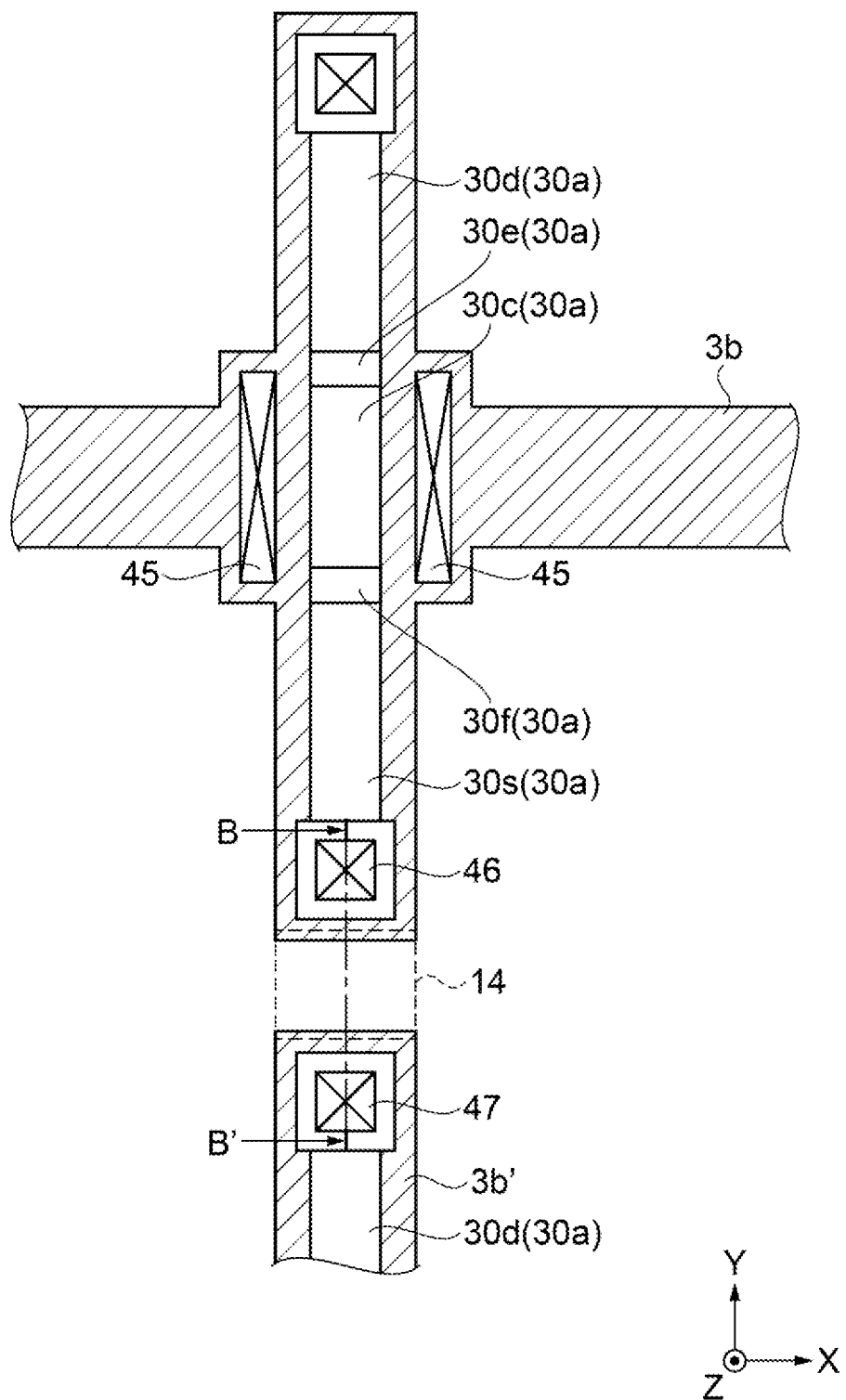
FIG. 7 is a schematic plan view illustrating an arrangement of main sections including a light shielding layer.

Next, a planar arrangement of the light shielding layer 14 will be described with reference to FIG. 7. FIG. 7 is a schematic plan view illustrating an arrangement of main sections including a light shielding layer. Note that, in FIG. 7, the semiconductor layer 30a and the area illustrated in FIG. 6 are illustrated in plan view, and the area illustrated in FIG. 6 is illustrated as the line B-B'. Also, in FIG. 7, in order to illustrate the planar arrangement of the light shielding layer 14, only the second scanning lines 3b, 3b', the semiconductor layer 30a, the contact holes 45, 46, and 47 are illustrated, and an area on which the light shielding layer 14 is disposed is denoted by a dashed line.

As illustrated in FIG. 7, the light shielding layer 14 is provided covering the gap between the second scanning line 3b and the second scanning line 3b' in the Y direction. The light shielding layer 14 does not overlap the channel area 30c and LDD area (low concentration impurity areas 30e and 30f) of the semiconductor layer 30a in plan view from a normal line direction (positive Z direction) on one surface of the base material 10s (see FIG. 6), and overlaps respective end portions of the second scanning line 3b and the second scanning line 3b'.

In the X direction, a distance (width) of the light shielding layer 14 is preferably greater than or equal to a distance (width) of the channel area 30c or the LDD area of the semiconductor layer 30a. More preferably, the distance (width) is larger than a distance (width) of a pad portion at an end of each of the high concentration impurity areas 30s and 30d, to which the contact holes 46, 47, and the like are coupled. Accordingly, a light shielding property for the semiconductor layer 30a can be further improved. In the present exemplary embodiment, the width of the light shielding layer 14 is substantially equal to a width of the second scanning lines 3b and 3b', is not particularly limited, but is approximately 1.0 µm, similar to the second scanning lines 3b and 3b' of the present exemplary embodiment, for example.

Whereas there is the gap between the second scanning line 3b and the second scanning line 3b' adjacent to each other in the Y direction, the second scanning line 3b along the X direction of the non-opening area (see FIG. 4B) extends without a gap. In other words, the second scanning lines 3b adjacent to each other sandwiching one pixel P (see FIG. 4A) in the X direction are electrically coupled.

The pair of contact holes 45 is provided sandwiching the channel area 30c of the semiconductor layer 30a in the X direction. As described above, the contact hole 45 electrically couples the first scanning line 3a (see FIG. 5) and the second scanning line 3b. Each contact hole 45 is a rectangle having a shape that is elongated in the Y direction in plan view. Accordingly, the contact holes 45 also have a function, like walls, to sandwich both sides of the channel area 30c, and shield light incident on the channel area 30c.

Note that, the present exemplary embodiment is an embodiment in which the semiconductor layer 30a extends in the Y direction, but is not limited thereto. The semiconductor layer 30a may extend in the X direction. In this case, the present exemplary embodiment is an embodiment in which a gap between the second scanning lines adjacent to each other in the X direction is covered by the light shielding layer.

As described above, according to the liquid crystal apparatus 100 as the electro-optical device according to the present exemplary embodiment, effects below can be achieved.

A light shielding property for the semiconductor layer 30a of the TFT 30 can be improved. Specifically, in addition to the second scanning lines 3b and 3b' having a light shielding property, the light shielding layer 14 is provided in a layer between each of the second scanning lines 3b and 3b' and the semiconductor layer 30a. The light shielding layer 14 covers the gap between the second scanning line 3b and the second scanning line 3b' adjacent to each other, and thus, diffracted light propagating from the gap to the semiconductor layer 30a is reduced. Thus, occurrence of a roundabout route to the semiconductor layer 30a can be suppressed for light from the side of the base material 10s on which the semiconductor layer 30a is provided, compared to the case in the past. As described above, the liquid crystal apparatus 100 having an improved light shielding property for the semiconductor layer 30a of the TFT 30 can be provided. Note that, the liquid crystal apparatus 100 is based on an assumption that light is incident from the side of the element substrate 10, but even when light is incident from the side of the counter substrate 20, a light shielding effect for the semiconductor layer 30a by the light shielding layer 14 can be obtained.

Since the light shielding layer 14 does not extend up to the channel area 30c and the LDD area (low concentration impurity areas 30e, 30f), uneven steps derived from the light shielding layer 14 do not occur in the channel area 30c and the LDD area. When the uneven steps occur in the channel area 30c and the LDD area, dimensional variations are likely to occur when patterning and forming the semiconductor layer 30a, and affect diode junction leakage variations. In other words, since the above uneven steps do not occur, the dimensional variations in the semiconductor layer 30a are less likely to occur, and the diode junction leakage variations can be suppressed.

Exemplary Embodiment 2

Light Shielding Structure of Element Substrate

Light shielding structure of an element substrate in a liquid crystal apparatus as an electro-optical device according to the present exemplary embodiment will be described. The liquid crystal apparatus of the present exemplary embodiment is obtained by changing the light shielding structure of the element substrate 10 in the liquid crystal apparatus 100 in Exemplary Embodiment 1, and includes the display area E (non-opening area and opening area) similar to that of the liquid crystal apparatus 100. Thus, also in descriptions of the liquid crystal apparatus of the present exemplary embodiment, the cross-sectional view taken along the line segment B-B' illustrated in FIG. 4B will be used. Note that, identical constituents to those in Exemplary Embodiment 1 are given identical reference signs, and redundant description of these constituents will be omitted.

Figure 8:
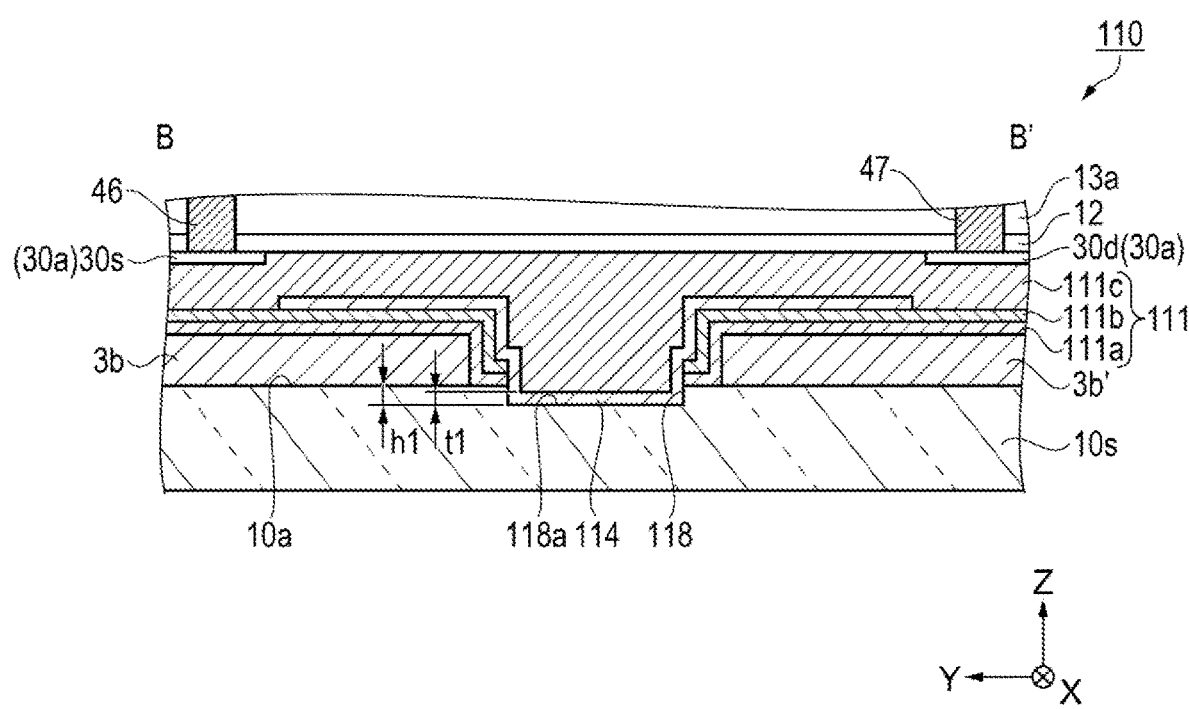
FIG. 8 is an enlarged cross-sectional view illustrating the structure of the element substrate taken along the line B-B' in FIG. 4B according to Exemplary Embodiment 2.
Figure 9:
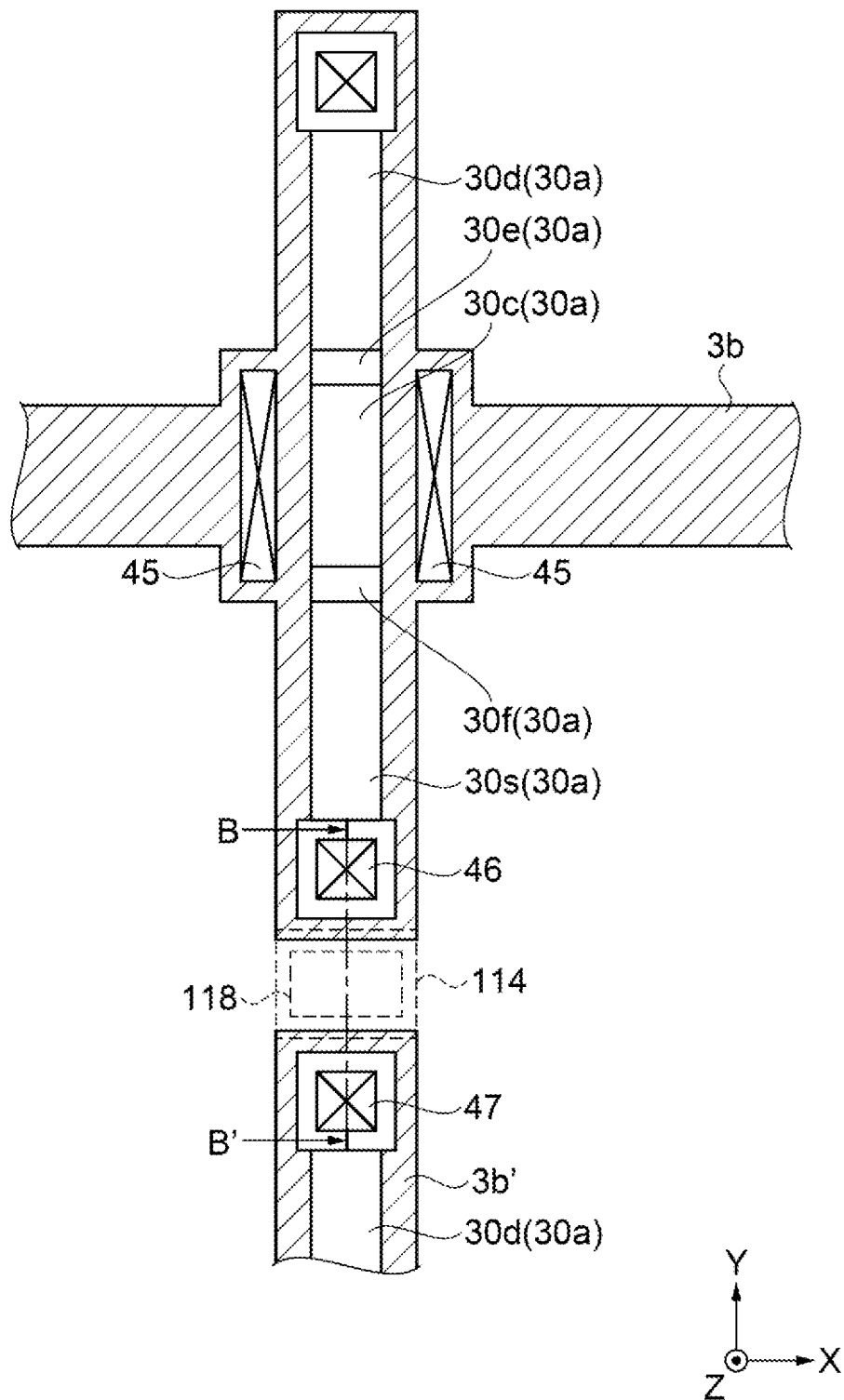
FIG. 9 is a schematic plan view illustrating an arrangement of main sections including a light shielding layer.

Hereinafter, descriptions will be given with reference to FIG. 8 and FIG. 9. FIG. 8 is an enlarged cross-sectional view illustrating the structure of the element substrate taken along the line B-B' in FIG. 4B according to Exemplary Embodiment 2. FIG. 9 is a schematic plan view illustrating an arrangement of main sections including a light shielding layer.

Here, in FIG. 8, an illustration of the fourth layer and higher is omitted. Additionally, in FIG. 9, the semiconductor layer 30a and the area illustrated in FIG. 8 are illustrated in plan view, and the area illustrated in FIG. 8 is illustrated as the line B-B'. Furthermore, in FIG. 9, in order to illustrate a planar arrangement of a light shielding layer 114, only the second scanning lines 3b, 3b', the semiconductor layer 30a, the contact holes 45, 46, and 47 are illustrated. In addition, an area where the light shielding layer 114 is disposed is denoted by a dashed line, and an area where a recessed portion 118 is disposed is denoted by a dotted line.

As illustrated in FIG. 8, an element substrate 110 of the liquid crystal apparatus according to the present exemplary embodiment includes a first base insulating layer 111a and a second base insulating layer 111b as interlayer insulating layers, and the recessed portion 118 provided on one surface 10a of the base material 10s as a substrate. The first base insulating layer 111a and the second base insulating layer 111b are provided in a layer between the light shielding layer 114 and each of the second scanning lines 3b and 3b'. The recessed portion 118 is provided on the gap between the second scanning line 3b and the second scanning line 3b' adjacent to each other in the Y direction, in plan view from a normal line direction (Z direction) on the one surface 10a of the base material 10s, in an area narrower than the above gap. That is, in the Y direction, a distance of the recessed portion 118 is smaller than a distance of the above gap. At least part of the light shielding layer 114 is provided in the recessed portion 118. The light shielding layer 114 is an example of the light shielding layer (light shielding structure) of the present disclosure. The present exemplary embodiment differs from Exemplary Embodiment 1 in that the recessed portion 118 is provided in the base material 10s, and part of the light shielding layer 114 is provided on a bottom surface 118a of the recessed portion 118.

Since the recessed portion 118 is provided in the Y direction in an area that is narrower than the gap between the second scanning line 3b and the second scanning line 3b' adjacent to each other, a distance between an end portion of the second scanning line 3b and an edge of the recessed portion 118, and a distance between an end portion of the second scanning line 3b' and an edge of the recessed portion 118 are secured.

The distance of the gap between the second scanning line 3b and the second scanning line 3b' in the Y direction is, as described above, for example, approximately 1.0 μm, and the distance in the Y direction of the recessed portion 118 is not particularly limited as long as the distance is smaller than the distance of the above gap, but is approximately 0.6 μm, for example.

The light shielding layer 114 is provided covering the above gap in the base insulating layer 111 as a layer between the semiconductor layer 30a and each of the second scanning lines 3b and 3b'. The base insulating layer 111 is configured with the first base insulating layer 111a, the second base insulating layer 111b, and a third base insulating layer 111c. The first base insulating layer 111a is provided covering an upside of each of the second scanning line 3b and the second scanning line 3b' and an upside of the base material 10s in the above gap, except for an inside of the recessed portion 118. The second base insulating layer 111b is provided covering an upside of the first base insulating layer 111a.

The light shielding layer 114 is provided covering the above gap including the inside of the recessed portion 118, and an upside of the second base insulating layer 111b. In particular, in the inside of the recessed portion 118, the first base insulating layer 111a and the second base insulating layer 111b are not interposed between the light shielding layer 114 and the bottom surface 118a, and the light shielding layer 114 and the bottom surface 118a are provided in contact with each other. In other words, the light shielding layer 114 is provided in the inside of the recessed portion 118 so as to be inserted into the base material 10s. Similar to Exemplary Embodiment 1, the first base insulating layer 111a and the second base insulating layer 111b prevent a short circuit between the light shielding layer 114 and each of the second scanning lines 3b and 3b'.

The light shielding layer 114 extends in the positive and negative Y directions as well, and covers an upside of an end portion of the second scanning line 3b on a side of the above gap and an upside of an end portion of the second scanning line 3b' on a side of the above gap. Accordingly, light incident from a side of the base material 10s can be prevented from taking a roundabout route from the gap between the second scanning line 3b and the second scanning line 3b', becoming diffracted light, and entering the semiconductor layer 30a. The light shielding layer 114 does not extend up to a downside of the semiconductor layer 30a (high concentration impurity areas 30d and 30s). Accordingly, unevenness that occurs above the light shielding layer 114 is less likely to reach the semiconductor layer 30a.

Here, the present exemplary embodiment is an embodiment in which the light shielding layer 114 does not extend up to a downside of the semiconductor layer 30a, but is not limited thereto. The light shielding layer 114 may extend up to a downside of each of the high concentration impurity areas 30d and 30s, as long as the light shielding layer 114 does not overlap the channel area 30c and the LDD area (low concentration impurity areas 30e and 30f) in the semiconductor layer 30a.

Here, a height h1 (distance in the Z direction) from the bottom surface 118a of the recessed portion 118 to the one surface 10a of the base material 10s is greater than a thickness t1 (distance in the Z direction) of the light shielding layer 114. In this way, whereas the second scanning lines 3b and 3b' are provided on the one surface 10a of the base material 10s, the light shielding layer 114 in the recessed portion 118 is provided in the negative Z direction below each of the second scanning lines 3b and 3b'. Accordingly, a light shielding property for the semiconductor layer 30a is further improved. The height h1 and the thickness t1 are not particularly limited, but it is sufficient that the height h1 is greater than or equal to 0 nm, for example, is approximately 250 nm, and the thickness t1 is approximately 200 nm, for example.

The third base insulating layer 111c is provided covering the light shielding layer 114, and an upside of the second base insulating layer 111b not covered with the light shielding layer 114.

In the present exemplary embodiment, silicon oxide is used as a forming material of the base insulating layer 111. Specifically, each of the first base insulating layer 111a and the third base insulating layer 111c is formed of a TEOS film, and the second base insulating layer 111b is formed of an HTO film. A thickness of the base insulating layer 111 is not particularly limited, but for example, a thickness of each of the first base insulating layer 111a and the second base insulating layer 111b is approximately 50 nm, and a thickness of the third base insulating layer 111c is approximately 200 nm.

For the light shielding layer 114, a forming material similar to that of the light shielding layer 14 of Exemplary Embodiment 1 described above can be adopted. For the light shielding layer 114, a three-layered structure including tungsten silicide, titanium, and tungsten silicide is adopted. The three-layered structure including tungsten silicide, titanium, and tungsten silicide has an excellent light shielding property compared to the second scanning lines 3b and 3b'. Alternatively, tungsten silicide (single-layer structure) similar to the second scanning lines 3b and 3b' may be used for the light shielding layer 114. In this case, taking into account a thickness of the second scanning lines 3b and 3b', the light shielding layer 114 is formed to have the thickness t1 of 200 nm or greater. In particular, in the inside of the recessed portion 118, the light shielding layer 114 is formed such that the thickness t1 is approximately equal to the thickness of the second scanning lines 3b and 3b'. In this case, the height h1 is approximately 100 nm.

The light shielding structure including the recessed portion 118 and the light shielding layer 114 described above, is formed by patterning the base material 10s, the first base insulating layer 111a, and the second base insulating layer 111b using an etching method. Specifically, after the first base insulating layer 111a and the second base insulating layer 111b are provided on each of the second scanning lines 3b and 3b', an etching process is performed on an area on which the recessed portion 118 is to be formed. The etching process forms the recessed portion 118 on the base material 10s. In addition, a known method can be adopted to form the light shielding layer 114, and patterning using, for example, a photolithography method can be adopted.

As illustrated in FIG. 9, the recessed portion 118 is provided in the gap between the second scanning line 3b and the second scanning line 3b' in the Y direction. The recessed portion 118 is provided in an area narrower than the width of the second scanning lines 3b and 3b' (width of the non-opening area), in the X direction. In other words, the distance (width) of the recessed portion 118 in the X direction is smaller than the width of the non-opening area, and is not particularly limited, but is approximately 0.8 μm, for example. This makes unevenness derived from the recessed portion 118 less likely reach the opening area.

As described above, the light shielding layer 114 is provided covering the gap between the second scanning line 3b and the second scanning line 3b' including the recessed portion 118. The light shielding layer 114 does not overlap the channel area 30c and the LDD area (low concentration impurity areas 30e and 30f) of the semiconductor layer 30a in plan view from the normal line direction (positive Z direction) on the one surface 10a of the base material 10s (see FIG. 8), and overlaps an end portions of each of the second scanning line 3b and the second scanning line 3b'.

As described above, according to the liquid crystal apparatus as the electro-optical device including the element substrate 110 according to the present exemplary embodiment, effects below can be obtained in addition to the effects of Exemplary Embodiment 1.

Part of the light shielding layer 114 is provided in the inside of the recessed portion 118 so as to cut into the base material 10s. In other words, the light shielding layer 114 in the inside of the recessed portion 118 is provided below the one surface 10a of the base material 10s. Thus, diffracted light is unlikely to propagate through the gap between the light shielding layer 114 and each of the second scanning lines 3b and 3b', and a light shielding property for the semiconductor layer 30a can be further improved.

Since the recessed portion 118 is provided in the Y direction in an area that is narrower than the gap between the second scanning line 3b and the second scanning line 3b' adjacent to each other, a distance between an end portion of the second scanning line 3b and an edge of the recessed portion 118, and a distance between an end portion of the second scanning line 3b' and an edge of the recessed portion 118 are secured. Accordingly, a short circuit between each of the second scanning lines 3b and 3b', and the light shielding layer 114 can be prevented.

The height h1 from the bottom surface 118a of the recessed portion 118 to the one surface 10a of the base material 10s is greater than the thickness t1 of the light shielding layer 114, so that the part of the light shielding layer 114 is provided so as to be inserted into the base material 10s. Thus, a light shielding property for the semiconductor layer 30a can be further improved.

Exemplary Embodiment 3

Light Shielding Structure of Element Substrate

A light shielding structure of an element substrate in a liquid crystal apparatus as an electro-optical device according to the present exemplary embodiment will be described. The liquid crystal apparatus of the present exemplary embodiment is obtained by changing the light shielding structure of the element substrate 10 in the liquid crystal apparatus 100 in Exemplary Embodiment 1, and includes the display area E (non-opening area and opening area) similar to that of the liquid crystal apparatus 100. Thus, also in descriptions of the liquid crystal apparatus of the present exemplary embodiment, the cross-sectional view taken along the line segment B-B' illustrated in FIG. 4B will be used. Note that, identical constituents to those in Exemplary Embodiment 1 are given identical reference signs, and redundant description of these constituents will be omitted.

Figure 10:
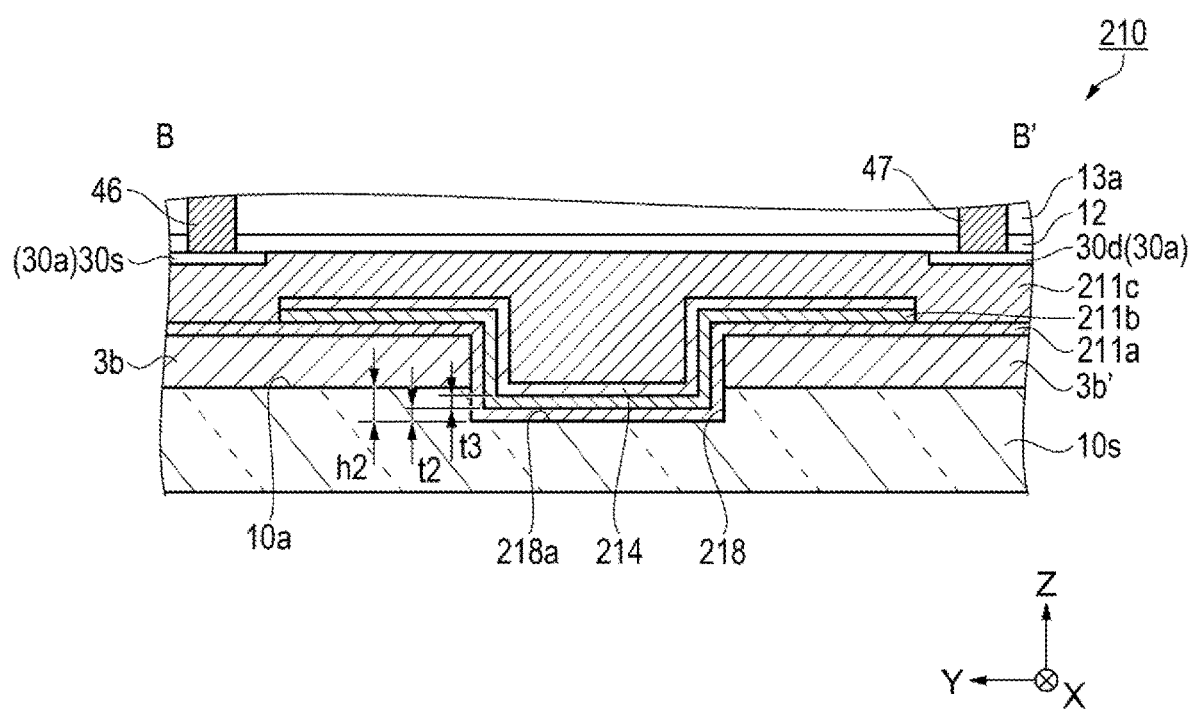
FIG. 10 is an enlarged cross-sectional view illustrating the structure of the element substrate taken along the line B-B' in FIG. 4B according to Exemplary Embodiment 3.

Hereinafter, descriptions will be given with reference to FIG. 10. FIG. 10 is an enlarged cross-sectional view illustrating the structure of the element substrate taken along the line B-B' in FIG. 4B according to Exemplary Embodiment 3. Note that, in FIG. 10, an illustration of the fourth layer and higher is omitted.

As illustrated in FIG. 10, an element substrate 210 according to the liquid crystal apparatus according to the present exemplary embodiment includes a light shielding layer 214, a first base insulating layer 211a as an interlayer insulating layer, and a light absorption layer 211b. The light shielding layer 214 is provided covering the gap between the second scanning line 3b and the second scanning line 3b', in the layer between the semiconductor layer 30a and each of the second scanning lines 3b and 3b'. The first base insulating layer 211a is provided in a layer between the light shielding layer 214 and each of the second scanning lines 3b and 3b'.

The light absorption layer 211b is provided in a layer between the light shielding layer 214 and the first base insulating layer 211a.

The element substrate 210 includes a recessed portion 218 provided on the one surface 10a of the base material 10s. The recessed portion 218 is provided in the gap between the second scanning line 3b and the second scanning line 3b' adjacent to each other in the Y direction, in plan view from the normal line direction (Z direction) on the one surface 10a of the base material 10s. The first base insulating layer 211a, the light absorption layer 211b, the light shielding layer 214, and a third base insulating layer 211c are provided in this order above the inside of the recessed portion 218 toward a side of the positive Z direction from the side of the base material 10s.

At least part of the light shielding layer 214 is provided in the inside of the recessed portion 218. The light shielding layer 214 is an example of the light shielding layer (light shielding structure) of the present disclosure, and the first base insulating layer 211a is an example of the interlayer insulating layer of the present disclosure. The present exemplary embodiment is different in that the light absorption layer 211b is included instead of the second base insulating layer 111b in the element substrate 110 of Exemplary Embodiment 2, and additionally, the first base insulating layer 211a and the light absorption layer 211b are interposed between a bottom surface 218a of the recessed portion 218 and the light shielding layer 214. Here, when the light absorption layer 211b has an insulating property, the first base insulating layer 211a may be omitted.

The light shielding layer 214 is provided covering the gap between the second scanning line 3b and the second scanning line 3b', in the first base insulating layer 211a and the third base insulating layer 211c as layers between the semiconductor layer 30a and each of the second scanning lines 3b and 3b'. The first base insulating layer 211a is provided covering an upside of each of the second scanning line 3b and the second scanning line 3b', and an upside of the base material 10s in the gap and the inside of the recessed portion 218.

The light absorption layer 211b covers the first base insulating layer 211a in the inside of the recessed portion 218, extends in the positive and negative Y directions, and extends up to a topside of an end portion of the second scanning line 3b on a side of the above gap, and an upside of an end portion of the second scanning line 3b' on a side of the above gap.

The light shielding layer 214 is provided covering the light absorption layer 211b. The light absorption layer 211b and the light shielding layer 214 do not extend up to the downside of the semiconductor layer 30a (high concentration impurity areas 30d and 30s). The third base insulating layer 211c is provided covering the light shielding layer 214, and an upside of the first base insulating layer 211a not covered with the light shielding layer 214.

A height h2 from the bottom surface 218a of the recessed portion 218 to the one surface 10a of the base material 10s is greater than a total value of a thickness t3 of the light absorption layer 211b and a thickness t2 of the first base insulating layer 211a. Accordingly, the first base insulating layer 211a, the light absorption layer 211b, and the light shielding layer 214 are provided in the inside of the recessed portion 218 so as to cut into the base material 10s. The height h2, the thicknesses t2 and t3 are not particularly limited, but it is sufficient that a total value of the thickness t2 and the thickness t3 is smaller than a value of the height h2. Accordingly, a surface below the light shielding layer 214 is positioned below the surface 10a. Thus, light incident from a side of the base material 10s reaches the light shielding layer 214 before reaching each of the second scanning lines 3b and 3b'. As described above, since the light absorption layer 211b is provided, for example, the height h2 is approximately 200 nm, the thickness t2 is approximately 50 nm, and the thickness t3 is approximately 50 nm.

Additionally, to cite another configuration, when the light shielding layer 214 is configured by using the three-layered structure including tungsten silicide, titanium, and tungsten silicide having a high light shielding property with a thickness of approximately 45 nm, and using silicon nitride with the thickness t3 of approximately 50 nm as the light absorption layer 211b, to combine the first base insulating layer 211a, then the thickness t2 is 0 nm. Accordingly, the height h2 is approximately 100 nm, and it is possible to reduce unevenness.

The light absorption layer 211b has a function to absorb light. Thus, when the light incident from the side of the base material 10s takes a roundabout route as diffracted light from the gap between the second scanning line 3b and the second scanning line 3b', firstly, the light is absorbed by the light absorption layer 211b, and then attenuated. The attenuated diffracted light is shielded by the light shielding layer 214 provided above the light absorption layer 211b. Accordingly, the diffracted light incident on the semiconductor layer 30a is further reduced, and a light shielding property for the semiconductor layer 30a is further improved.

In the present exemplary embodiment, as a forming material for the first base insulating layer 211a and the third base insulating layer 211c, silicon oxide is used. Specifically, each of the first base insulating layer 211a and the third base insulating layer 211c is formed of a TEOS film. A thickness of each of these layers is not particularly limited, but, for example, the thickness of the first base insulating layer 211a is approximately 50 nm, and the thickness of the third base insulating layer 211c is approximately 200 nm.

For the light absorption layer 211b, a forming material having a light absorption property can be adopted. In the present exemplary embodiment, titanium oxide is adopted for the light absorption layer 211b. A thickness of the light absorption layer 211b is not particularly limited, but is approximately 50 nm, for example. A detailed configuration of the light absorption layer 211b will be described later.

For the light shielding layer 214, a forming material similar to that of the light shielding layer 14 in the above-described Exemplary Embodiment 1 can be adopted. In the present exemplary embodiment, for the light shielding layer 214, the three-layered structure including tungsten silicide, titanium, and tungsten silicide is adopted.

The recessed portion 218 is provided, in plan view, in the Y direction, in an area that substantially overlaps the gap between the second scanning lines 3b and the second scanning 3b', and in the X direction, in an area, although not illustrated, narrower than the width of the second scanning lines 3b and 3b'.

The light shielding structure including the recessed portion 218, the light shielding layer 214, and the light absorption layer 211b described above is formed by patterning the base material 10s using an etching method. In detail, an upside of the base material 10s is subjected to an etching process to form the recessed portion 218. Next, the first base insulating layer 211a, the light absorption layer 211b, and the light shielding layer 214 are provided and patterned in order. For forming the light shielding layer 214, the light absorption layer 211b, and the like, a known method can be adopted, and for example, patterning using a photolithography method is used.

Configuration of Light Absorption Layer

Figure 11:
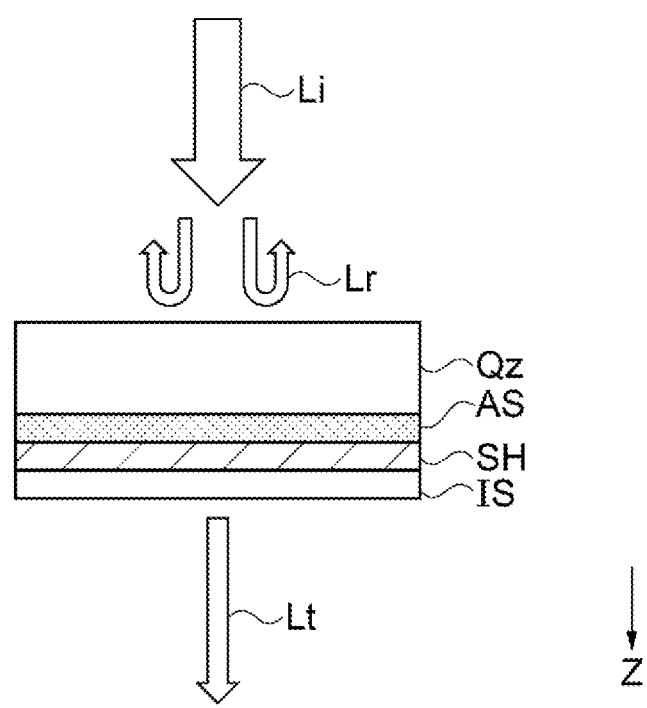
FIG. 11 is a schematic cross-sectional view illustrating a model layer structure such as a light absorption layer and a light shielding layer in an optical simulation.

Adjusting a configuration of the light absorption layer 211b can further reduce the diffracted light incident on the semiconductor layer 30a. In detail, as the configuration to be adjusted in the light absorption layer 211b, a refractive index n, a thickness ta, and an extinction coefficient k that is related to light absorption may be cited. Hereinafter, with reference to the drawings, the configuration of the light absorption layer 211b that is preferable based on an optical simulation will be described. FIG. 11 is a schematic cross-sectional view illustrating model layer structure such as a light absorption layer and a light shielding layer in the optical simulation. FIGS. 12A, 12B, FIGS. 13A, 13B, FIGS. 14A, and 14B are graphs showing results of the optical simulation.

First, the model layer structure in the optical simulation will be described with reference to FIG. 11. The above model layer structure was a structure in which a light absorption layer AS, a light shielding layer SH, and an insulating layer IS were stacked in this order on a quartz substrate Qz with a refractive index of 1.46 (a side of the positive Z direction). In other words, the light absorption layer AS was provided between the light shielding layer SH and the quartz substrate Qz. The quartz substrate Qz was provided based on an assumption of the base material 10s. The light absorption layer AS was provided based on an assumption of the light absorption layer 211b. The light shielding layer SH was provided based on an assumption of the light shielding layer 214, but in the optical simulation, a forming material was a single layer of tungsten silicide. The insulating layer IS was provided based on an assumption of the third base insulating layer 211c.

Two types of thicknesses of 100 nm and 200 nm were set for the light shielding layer SH. Tungsten silicide of the light shielding layer SH had a refractive index of 5.5 and an extinction coefficient of 0.9.

The insulating layer IS was a silicon oxide layer with a refractive index of 1.46 identical to that of the quartz substrate Qz, and with a thickness of 200 nm. An extinction coefficient of the insulating layer IS (silicon oxide) was 0.0.

A thickness ta of the light absorption layer AS was set to 50 nm. The thickness ta of the light absorption layer AS of 50 nm made it easier to manufacture the light absorption layer AS. When the thickness ta of the light absorption layer AS is 50 nm or less, occurrence of cracking in the light absorption layer AS can be reduced. A range of the refractive index n of the light absorption layer AS was set to 1.2 to 4.5. A range of the extinction coefficient k of the light absorption layer AS was set to 0.0 to 3.0.

With an intensity of incident light incident on a medium being $I_0$, an intensity I of light when the light travels for a distance x in the medium is expressed by a mathematical formula (1) below according to Lambert's law.

$$I = I_0 \exp(-\alpha x) \quad (1)$$

Here, a constant $\alpha$ is referred to as an absorption coefficient. Furthermore, when a wavelength of light in a vacuum is $\lambda$, Expression (2) below holds between the absorption coefficient (constant $\alpha$) and the extinction coefficient k.

$$\alpha = 4\pi k/\lambda \quad (2)$$

The optical simulation was performed based on an assumption of the model layer structure described above, and a ratio of intensity of reflected light Lr with respect to intensity of light Li incident from a side of the quartz substrate Qz, that is, reflectance, an Optical Density (OP) value indicating a light shielding property, and absorptivity of light were determined. The OD value can be determined as a percentage of intensity of transmitted light Lt with respect to the intensity of the light Li incident from the side of the quartz substrate Qz, that is, a logarithm of a reciprocal of transmittance. When the intensity of the light Li incident from the side of the quartz substrate Qz is, for example, defined as 1, the absorptivity is a value obtained by subtracting the reflectance and the transmittance from 1.

Note that, the refractive index and the extinction coefficient of the forming material of each layer in the above model layer structure are values based on an assumption of light having a wavelength of 550 nm.

In the model layer structure described above, a preferable state in which diffracted light incident on the semiconductor layer 30a is reduced is a state in which the intensity of the reflected light Lr or the transmitted light Lt decreases with respect to the intensity of the incident light Li. In other words, it is preferable that reflectivity (reflectance) be low and a light shielding property (OD value) and absorbency (absorptivity) be high with respect to the incident light Li.

Next, the results of the optical simulation will be described with reference to FIGS. 12A, 12B, FIGS. 13A, 13B, FIGS. 14A and 14B (hereinafter, also simply referred to as "FIG. 12A to FIG. 14B"). FIG. 12A to FIG. 14B show the reflectance, the OD value, and the absorptivity, when the refractive index n of the light absorption layer AS was set to 1.2, 1.5, 2.0, 2.5, 3.0, 3.5, 4.0, and 4.5. In detail, each of FIGS. 12A and 12B includes graphs of the reflectance (%), each of FIGS. 13A and 13B includes graphs of the OD value, and each of FIGS. 14A and 14B includes graphs of the absorptivity (%). Further, in FIG. 12A to FIG. 14B, under two types of conditions in which the thickness of the light shielding layer SH was set to 100 nm or 200 nm, the extinction coefficient k of the light absorption layer AS was changed from 0.0 to 0.3 in steps of 0.1, and changed from 0.5 to 3.0 in steps of 0.5. Note that, in FIGS. 14A and 14B, in the model layer structure described above, the absorption rate (65%) when the light absorption layer AS was omitted is denoted by a dashed line.

Figure 12A:
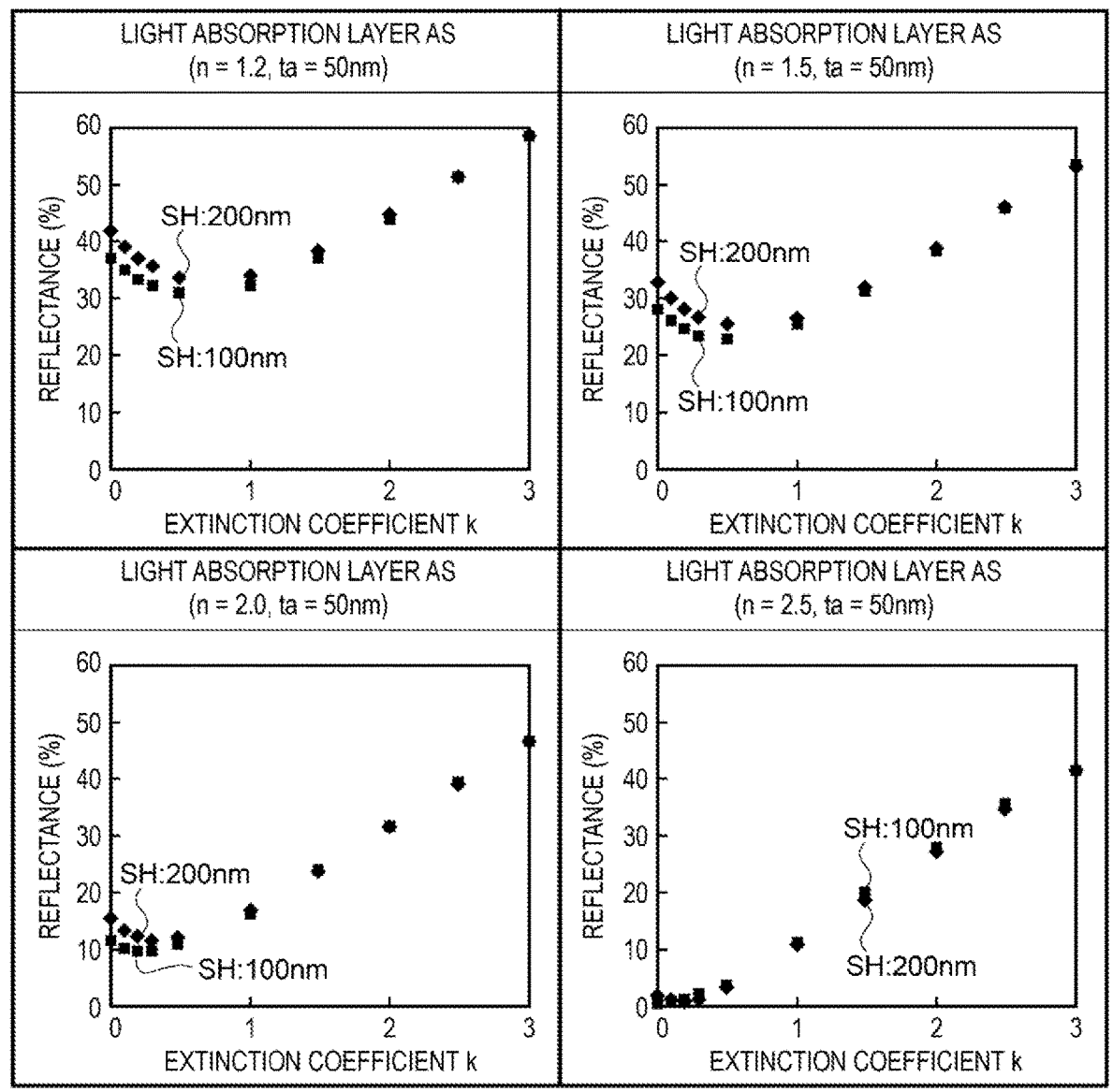
FIG. 12A includes graphs showing results of the optical simulation.
Figure 12B:
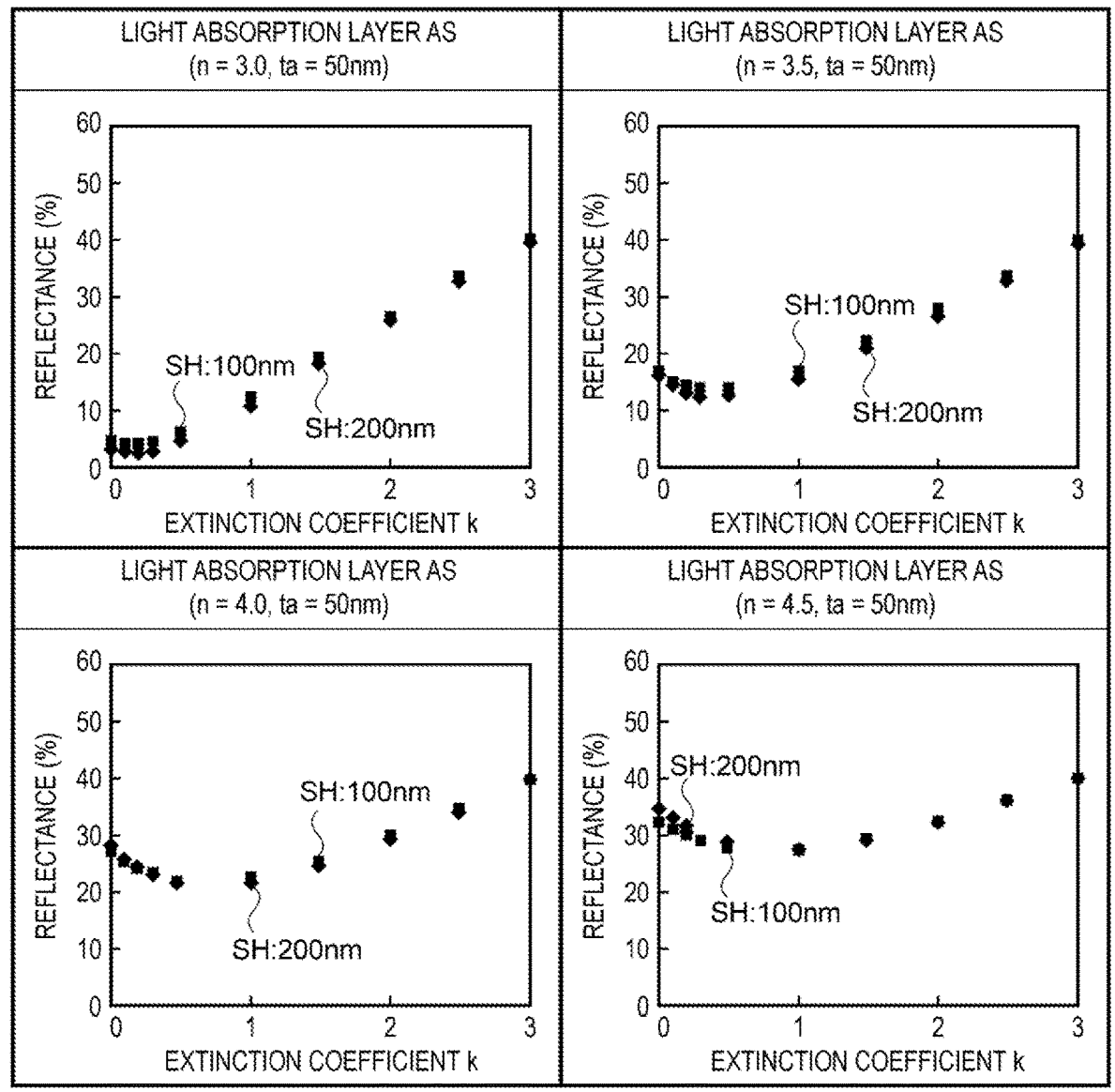
FIG. 12B includes graphs showing results of the optical simulation.

As shown in FIG. 12A, a minimal value of the reflectance when the refractive index n=1.2 was approximately 30%, and a minimal value of the reflectance when refractive index n=1.5 was approximately 20% or more. In other words, by changing the refractive index n from 1.2 to 1.5, the reflectance was improved by approximately 10%. This trend was maintained until the refractive index n reached 2.5, and as the refractive index n increased, the minimal value of the reflectance gradually decreased. Additionally, the minimal value of the reflectance when the refractive index n=2.5 was approximately 0%. Also, as shown in FIG. 12B, as the refractive index n increased from 3.0 to 4.5, the minimal value of the reflectance increased. Thus, in order to keep the minimal value of the reflectance less than or equal to approximately 20%, the refractive index n is preferably in a range of 1.5 or more and 4.0 or less.

Figure 13A:
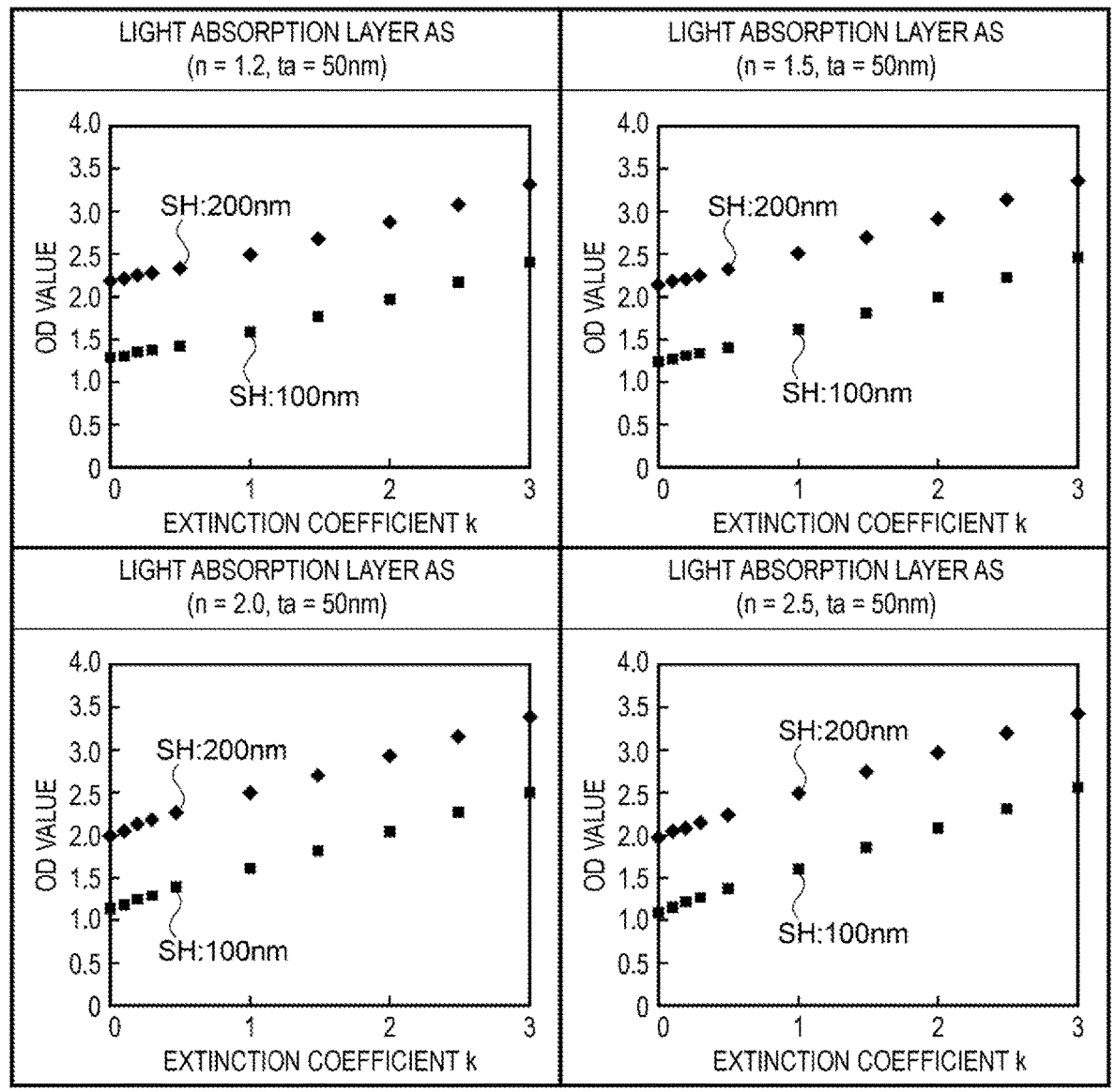
FIG. 13A includes graphs showing results of the optical simulation.
Figure 13B:
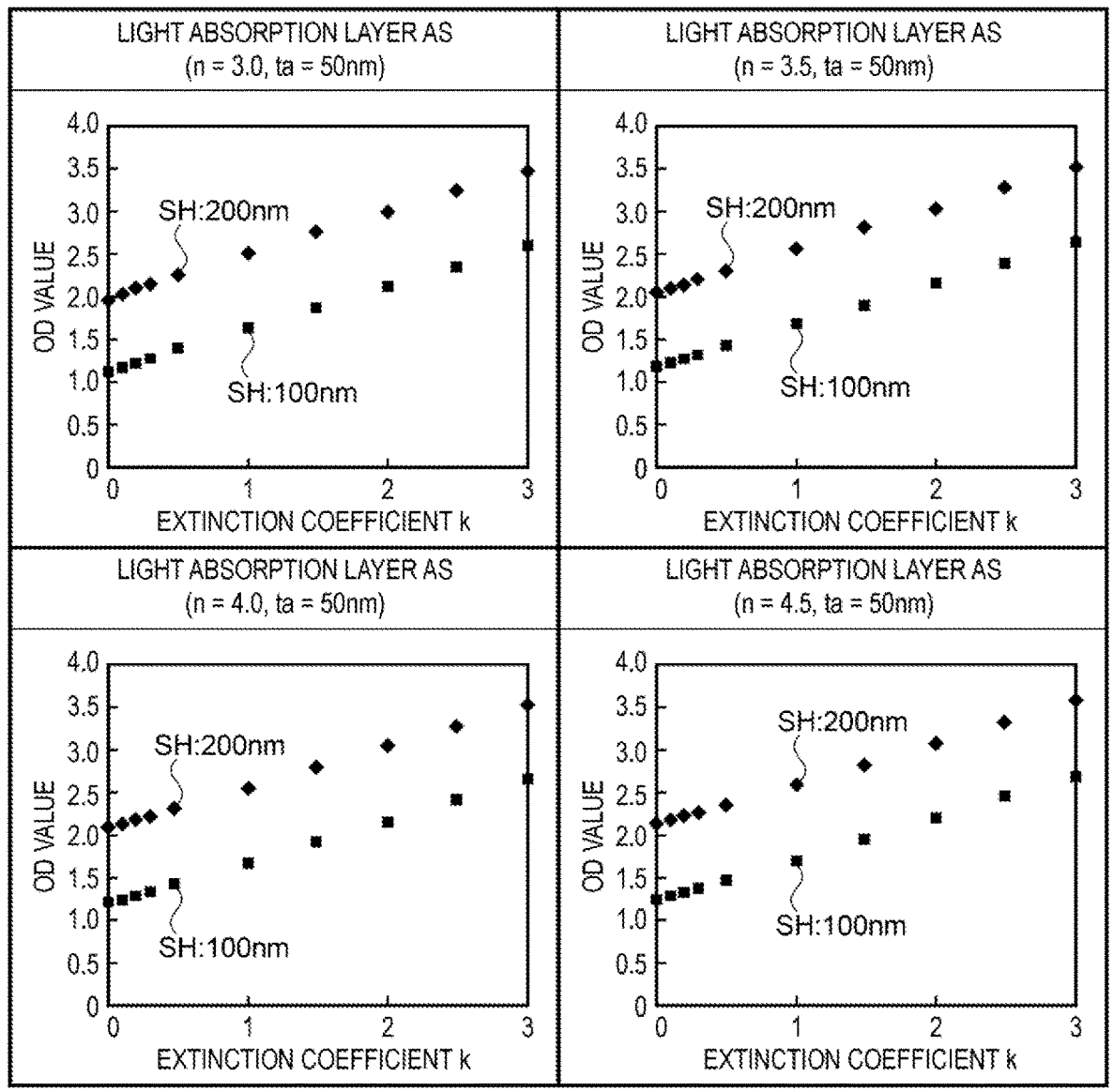
FIG. 13B includes graphs showing results of the optical simulation.

As shown in FIGS. 13A and 13B, the OD value as an index of a light shielding property, was almost independent of the refractive index n of the light absorption layer AS, but was correlated with the value of the extinction coefficient k of the light absorption layer AS. Additionally, the OD value was dependent on the thickness of the light shielding layer SH, and was higher by approximately 1.0 in a case in which the thickness of the light shielding layer SH was 200 nm, compared to a case of 100 nm.

Figure 14A:
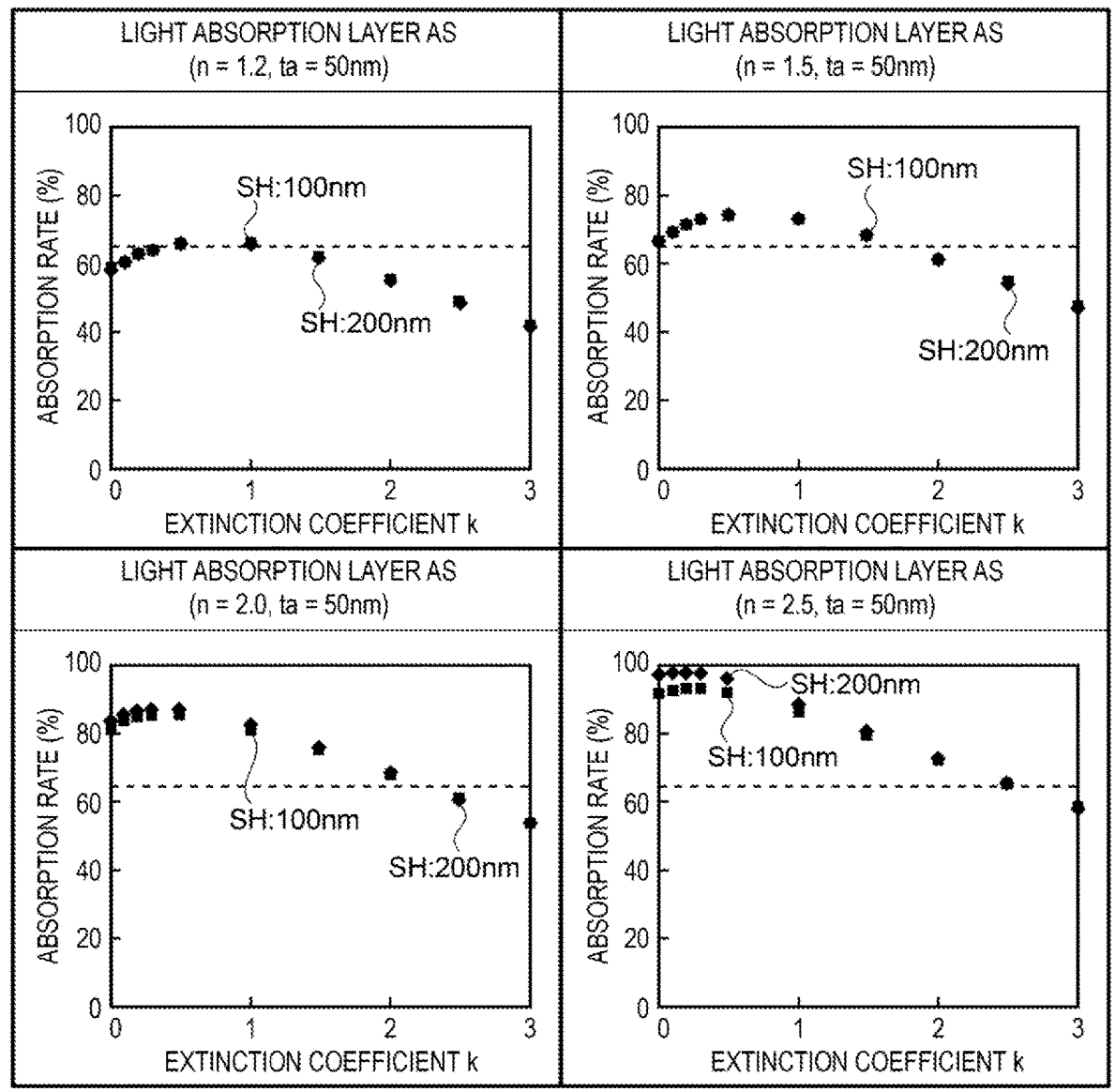
FIG. 14A includes graphs showing results of the optical simulation.
Figure 14B:
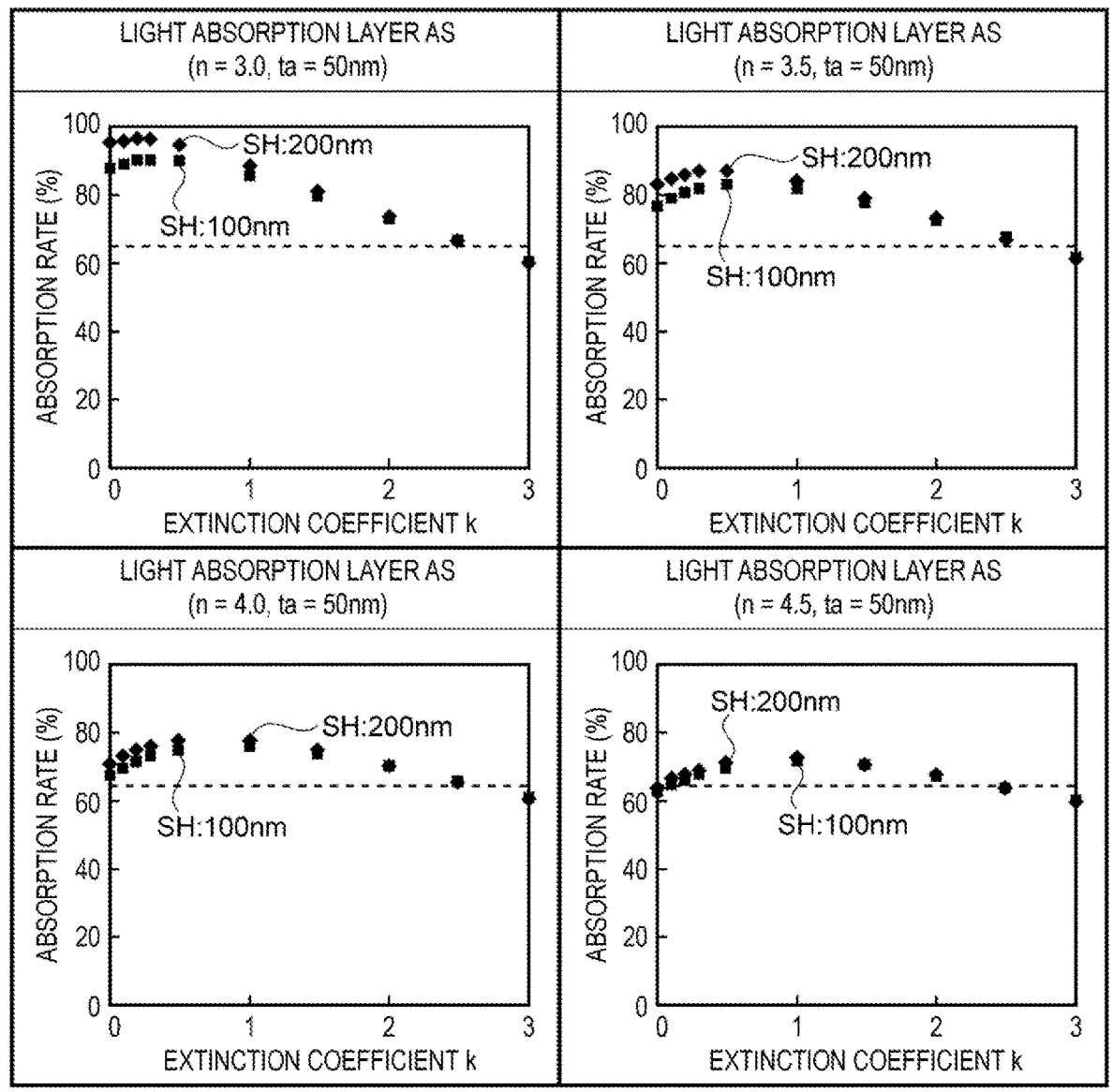
FIG. 14B includes graphs showing results of the optical simulation.

As shown in FIGS. 14A and 14B, improvement of the absorptivity when the refractive index n was 1.2 and 4.5 was not observed, compared to a case in which the light absorption layer AS was omitted as illustrated in comparison (dashed line: absorption rate 65%). Compared to this, in a range of the refractive index n from 1.5 to 4.0, and in a range of the extinction coefficient k approximately from 0.0 to 2.0, the absorption rate exceeded 65%. Additionally, in the same ranges, and when the extinction coefficient k was approximately 0 to 1, and when the thickness of the light shielding layer SH was 200 nm, the absorptivity was at a high level, but even when the thickness was 100 nm, an effect of improving the absorption rate was obtained. Accordingly, by setting the thickness of the light shielding layer SH (light shielding layer 214) to be small, an occurrence of cracking in the light shielding layer 214 can be reduced. Thus, in order to make the absorption rate by the light absorption layer 65% or more, the refractive index n is preferably set to 1.5 or more and 4.0 or less, and the extinction coefficient k is preferably set to 0.0 or more and 2.0 or less.

From the above, in order to further reduce the diffracted light incident on the semiconductor layer 30a by the light absorption layer AS, or the light absorption layer 211b, the light absorption layer 211b preferably includes a forming material having the refractive index n of 1.5 or more and 4.0 or less, and the extinction coefficient k of 0.0 or more and 2.0 or less. This reduces reflectance of incident light, and an absorption rate of incident light can be improved.

A forming material for the light absorption layer 211b described above is not particularly limited, but examples include Ti (titanium) or titanium oxide. For example, with a wavelength of light being 550 nm, for a metal film composed of Ti, a refractive index is approximately 1.92 and an extinction coefficient is approximately 2.67. When oxidation of a metal film made of Ti progresses and the metal film completely becomes a Ti oxide film ($TiO_2$), a refractive index increases to approximately 2.5 (amorphous) or 2.95 (rutile), and an extinction coefficient becomes nearly zero. Furthermore, examples of forming materials other than Ti include respective insulating films made of Hf (hafnium) and Zr (zirconium) that prefer bonding with oxygen rather than bonding with silicon, $HfO_2$, $ZrO_2$, and silicon oxynitride, silicon nitride, and the like each having a refractive index higher than that of silicon oxide.

As described above, according to the liquid crystal apparatus as the electro-optical device including the element substrate 210 according to the present exemplary embodiment, effects below can be obtained in addition to the effects of Exemplary Embodiment 1.

Diffracted light propagating from between the light shielding layer 214 and each of the second scanning lines 3b or 3b' to the semiconductor layer 30a is absorbed by the light absorption layer 211b and attenuated. Thus, a light shielding property for the semiconductor layer 30a can be further improved. In addition, the first base insulating layer 211a can prevent a short circuit between the light shielding layer 214 and each of the second scanning lines 3b and 3b'.

Even when the first base insulating layer 211a is provided between the light shielding layer 214 and the base material 10s in the inside of the recessed portion 218, the light shielding layer 214 is provided, in a normal line direction on the one surface 10a of the base material 10s, at a position closer to another surface of the base material 10s than each of the second scanning lines 3b and 3b'. Thus, a light shielding property for the semiconductor layer 30a can be further improved.

Exemplary Embodiment 4

Light Shielding Structure of Element Substrate

Light shielding structure of an element substrate in a liquid crystal apparatus as an electro-optical device according to the present exemplary embodiment will be described. The liquid crystal apparatus of the present exemplary embodiment is obtained by changing the arrangement of the light shielding layer 14 in the liquid crystal apparatus 100 in Exemplary Embodiment 1, and includes the display area E (non-opening area and opening area) similar to the liquid crystal apparatus 100. Thus, in descriptions of the present exemplary embodiment, an enlarged view of an area corresponding to the gap between the second scanning line 3b and the second scanning line 3b' in Exemplary Embodiment 1 will be used.

Figure 15:
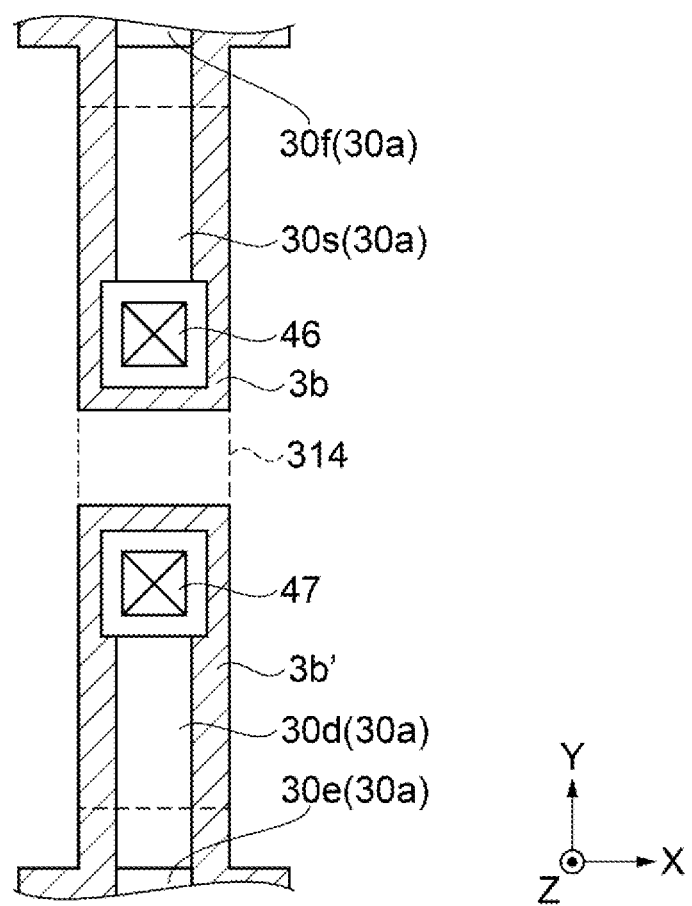
FIG. 15 is an enlarged plan view illustrating an arrangement of a light shielding layer according to Exemplary Embodiment 4.

Hereinafter, descriptions will be given with reference to FIG. 15. FIG. 15 is an enlarged plan view illustrating an arrangement of a light shielding layer according to Exemplary Embodiment 4. In FIG. 15, in order to illustrate a planar arrangement of a light shielding layer 314 according to the present exemplary embodiment, only part of the second scanning line 3b, 3b', and the semiconductor layer 30a is illustrated, and an area in which the light shielding layer 314 is disposed is denoted by a dashed line. Note that, identical constituents to those in Exemplary Embodiment 1 are given identical reference signs, and redundant description of these constituents will be omitted.

As illustrated in FIG. 15, the light shielding layer 314 of the present exemplary embodiment is provided covering the gap between the second scanning line 3b and the second scanning line 3b' in the Y direction. The light shielding layer 314 overlaps an end portion of each of the second scanning line 3b and the second scanning line 3b' in plan view from the positive Z direction, and additionally, is provided while an area thereof in the Y direction is enlarged. In other words, the light shielding layer 314 is disposed up to an area closer to the LDD area (the low concentration impurity area 30e and 30f), compared to Exemplary Embodiment 1.

Thus, diffracted light that takes a roundabout route from the gap between the second scanning line 3b and the second scanning line 3b is further less likely to propagate to the LDD area and the channel area 30c (see FIG. 7). Thus, according to the light shielding structure of the element substrate according to the present exemplary embodiment, in addition to the effects of Exemplary Embodiment 1, a light shielding property can be further improved.

Exemplary Embodiment 5

Light Shielding Structure of Element Substrate

Light shielding structure of an element substrate in a liquid crystal apparatus as an electro-optical device according to the present exemplary embodiment will be described. The liquid crystal apparatus of the present exemplary embodiment is obtained by changing the light shielding structure of the element substrate 10 in the liquid crystal apparatus 100 in Exemplary Embodiment 1, and includes the display area E (non-opening area and opening area) similar to that of the liquid crystal apparatus 100. Thus, also in descriptions of the liquid crystal apparatus of the present exemplary embodiment, the cross-sectional view taken along the line segment B-B' illustrated in FIG. 4B will be used. Note that, identical constituents to those in Exemplary Embodiment 1 are given identical reference signs, and redundant description of these constituents will be omitted.

Figure 16:
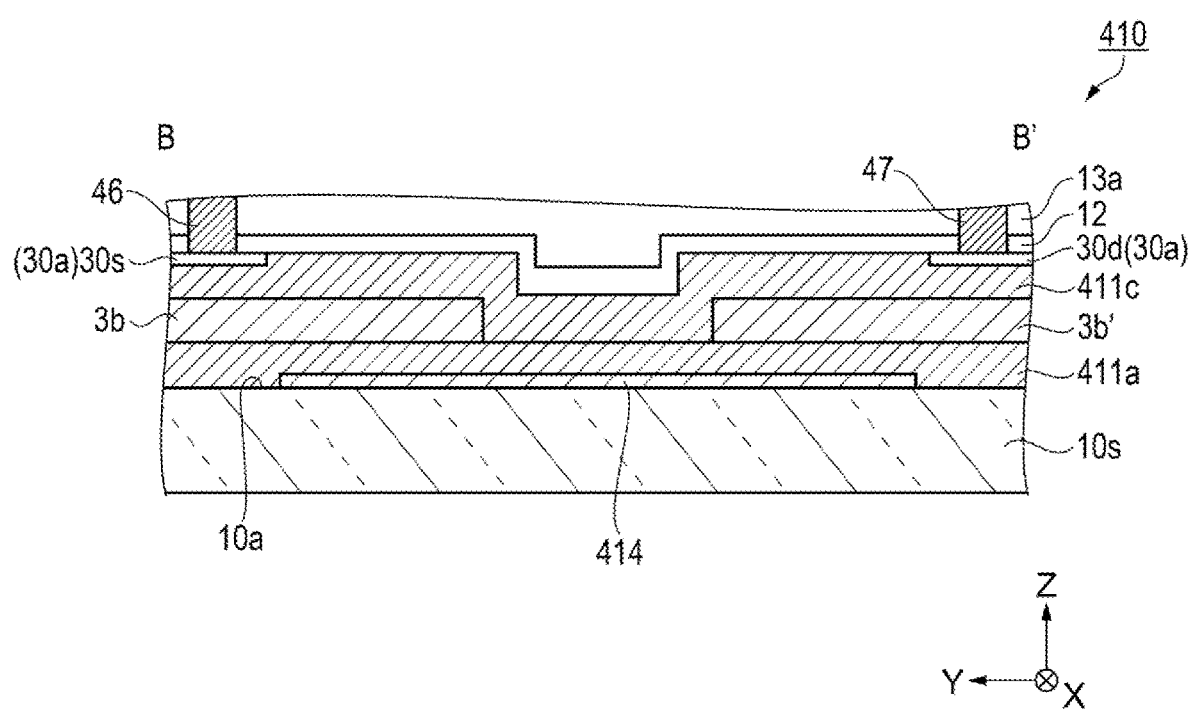
FIG. 16 is an enlarged cross-sectional view illustrating the structure of the element substrate taken along the line B-B' in FIG. 4B according to Exemplary Embodiment 5.

Hereinafter, descriptions will be given with reference to FIG. 16. FIG. 16 is an enlarged cross-sectional view illustrating the structure of the element substrate taken along the line B-B' in FIG. 4B according to Exemplary Embodiment 5. Note that, in FIG. 16, an illustration of the fourth layer and higher is omitted.

As illustrated in FIG. 16, an element substrate 410 of a liquid crystal apparatus according to the present exemplary embodiment includes the base material 10s as a substrate, the TFT 30 (not illustrated), the second scanning lines 3b, 3b', and a light shielding layer 414. The second scanning lines 3b and 3b' are provided in a layer between the semiconductor layer 30a of the TFT 30 and the base material 10s, and have a light shielding property.

The light shielding layer 414 is provided in a layer between the base material 10s and a first base insulating layer 411a. In other words, in plan view from a normal line direction (positive Z direction) on the one surface 10a of the base material 10s, the light shielding layer 414 is provided so as to overlap each of an end portion of the second scanning line 3b and an end portion of the second scanning line 3b', between the second scanning line 3b and the second scanning line 3b' adjacent to the second scanning line 3b. Note that, the light shielding layer 414 is an example of the light shielding layer (light shielding structure) of the present disclosure. As described above, the element substrate 410 of the present exemplary embodiment differs from Exemplary Embodiment 1 in that the light shielding layer 414 is provided on a side of the negative Z direction (downward) with respect to each of the second scanning lines 3b and 3b'.

Specifically, the light shielding layer 414 is provided above (a side of the positive Z direction) the one surface 10a of the base material 10s. The light shielding layer 414 overlaps the end portion of each of the second scanning lines 3b and 3b', and extends in the positive and negative Y directions. The arrangement of the light shielding layer 414 in plan view described above is similar to that of the light shielding layer 14 of Exemplary Embodiment 1. Accordingly, light incident from a side of the base material 10s can be suppressed from taking a roundabout route from the gap between the second scanning line 3b and the second scanning line 3b', becoming diffracted light, and entering the semiconductor layer 30a.

The first base insulating layer 411a is provided covering the light shielding layer 414 and the one surface 10a of the base material 10s on which the light shielding layer 414 is not provided. In other words, the first base insulating layer 411a is provided covering an upside of the light shielding layer 414 in a layer between the base material 10s and each of the second scanning lines 3b and 3b'. The first base insulating layer 411a prevents a short circuit between the light shielding layer 414 and each of the second scanning line 3b and 3b'. Note that, the present exemplary embodiment is an embodiment in which the light shielding layer 414 does not extend up to a downside of the semiconductor layer 30a, but is not limited thereto. The light shielding layer 414 may extend up to a downside of each of the high concentration impurity areas 30d and 30s, as long as the light shielding layer 414 does not overlap each of the channel area 30c and the LDD area (the low concentration impurity areas 30e and 30f) in the semiconductor layer 30a.

For the light shielding layer 414, a forming material similar to that of the light shielding layer 14 described above can be adopted. In the present exemplary embodiment, a single layer of tungsten silicide (thickness of approximately 200 nm) is adopted as the light shielding layer 414. A known method can be adopted to form the light shielding layer 414, and patterning using, for example, a photolithography method is used.

Here, the first base insulating layer 411a is subjected to chemical and mechanical treatment in order to mitigate unevenness occurring above the first base insulating layer 411a due to provision of the light shielding layer 414. Accordingly, the unevenness above the first base insulating layer 411a derived from the light shielding layer 414 is reduced, and the effects of the unevenness are suppressed from reaching the second scanning lines 3b, 3b', and the like.

The second scanning lines 3b and 3b' are provided above the first base insulating layer 411a. Arrangement of the second scanning lines 3b and 3b' in plan view from the positive Z direction is similar to that of the element substrate 10 of Exemplary Embodiment 1.

A third base insulating layer 411c is provided covering the first base insulating layer 411a between the second scanning line 3b and the second scanning line 3b' and an upside of each of the second scanning lines 3b and 3b'.

In the present exemplary embodiment, silicon oxide is used for a forming material of the first base insulating layer 411a and the third base insulating layer 411c. Specifically, each of the first base insulating layer 411a and the third base insulating layer 411c is formed of a TEOS film. The TEOS film has high film formability and can be formed with a good coating state even with a relatively large film thickness, and has a sufficient insulating property. The TEOS film may be substituted with a silicate glass other than TEOS or silicon oxide.

A thickness of each of the first base insulating layer 411a and the third underlying insulating layer 411c is not particularly limited, but for example, the thickness of the first base insulating layer 411a is approximately 200 nm, and the thickness of the third base insulating layer 411c is approximately 250 nm.

In the element substrate 410 of the present exemplary embodiment, a layer configuration above the third base insulating layer 411c is similar to that of the element substrate 10 of Exemplary Embodiment 1.

As described above, according to the liquid crystal apparatus as the electro-optical device including the element substrate 410 according to the present exemplary embodiment, effects similar to those of Exemplary Embodiment 1 can be obtained.

Exemplary Embodiment 6

Electronic Apparatus

Figure 17:
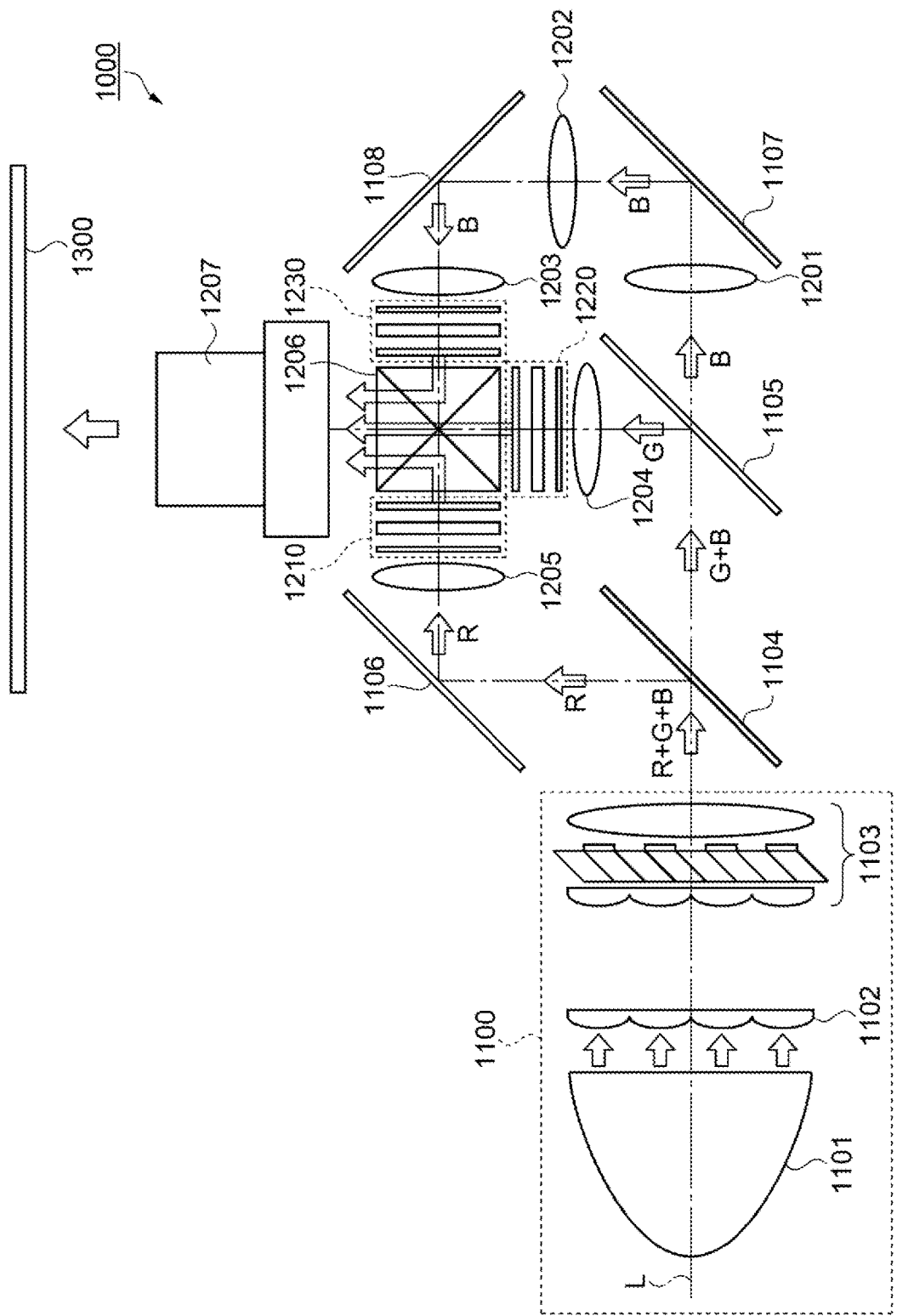
FIG. 17 is a schematic view illustrating a configuration of a projection-type display device as an electronic apparatus according to Exemplary Embodiment 6.

A projection-type display device as an electronic apparatus of the present exemplary embodiment will be described with reference to FIG. 17. FIG. 17 is a schematic view illustrating a configuration of the projection-type display device as the electronic apparatus according to Exemplary Embodiment 6.

A projection-type display device 1000 according to the present exemplary embodiment is mounted with the liquid crystal apparatus of the above-described embodiments.

As illustrated in FIG. 17, the projection-type display device 1000 includes a polarized light illumination device 1100 disposed along a system optical axis L, two dichroic mirrors 1104, 1105 as light separation elements, three reflection mirrors 1106, 1107, 1108, five relay lenses 1201, 1202, 1203, 1204, 1205, three transmissive liquid crystal light valves 1210, 1220, 1230 as optical modulation units, a cross dichroic prism 1206 as a photosynthesis element, and a projection lens 1207.

The polarized light illumination device 1100 is schematically configured with a lamp unit 1101 being as a light source including a white light source such as an extra-high pressure mercury lamp or a halogen lamp, an integrator lens 1102, and a polarization conversion element 1103.

The dichroic mirror 1104 reflects red light (R) of a polarized light flux emitted from the polarized light illumination device 1100 and transmits green light (G) and blue light (B). The other dichroic mirror 1105 reflects the green light (G) transmitted by the dichroic mirror 1104 and transmits the blue light (B).

The red light (R) reflected by the dichroic mirror 1104 is reflected by the reflection mirror 1106 and subsequently is incident on the liquid crystal light valve 1210 via the relay lens 1205. The green light (G) reflected by the dichroic mirror 1105 is incident on the liquid crystal light valve 1220 via the relay lens 1204. The blue light (B) transmitted by the dichroic mirror 1105 is incident on the liquid crystal light valve 1230 via a light guide system including the three relay lenses 1201, 1202, 1203 and the two reflection mirrors 1107 and 1108.

The liquid crystal light valves 1210, 1220, and 1230 are each disposed to face an incident surface of each type of color light of the cross dichroic prism 1206. The color light incident on the liquid crystal light valves 1210, 1220, 1230 is modulated based on video information (video signal) and exits toward the cross dichroic prism 1206.

In this prism, four rectangular prisms are bonded together, and in inner surfaces of the prisms, a dielectric multilayer film configured to reflect the red light and a dielectric multilayer film configured to reflect the blue light are formed in a cross shape. The three types of color light are synthesized by these dielectric multilayer films, and light representing a color image is synthesized. The synthesized light is projected onto a screen 1300 by the projection lens 1207 being as a projection optical system, and an image is enlarged and displayed.

The liquid crystal light valve 1210 is a liquid crystal valve to which the liquid crystal apparatus 100 (see FIG. 1) described above is applied. The liquid crystal apparatus 100 is disposed between a pair of light-polarizing elements disposed in a crossed-Nicols state at an incident side and an exit side of the color light with a gap interposed therebetween. The same applies to the other liquid crystal light valves 1220, 1230. Note that, the liquid crystal apparatus applied to the liquid crystal light valve 1210 is not limited to the liquid crystal apparatus 100 in Exemplary Embodiment 1, and the liquid crystal apparatus of the above-described embodiment other than Exemplary Embodiment 1 is also applicable.

According to the projection-type display device 1000 described above, the liquid crystal apparatus 100 of Exemplary Embodiment 1 is used, so a light shielding property for the semiconductor layer 30a (see FIG. 6) in the liquid crystal apparatus 100 is improved, and an off-leak current in the TFT 30 (see FIG. 5) is reduced. Thus, the projection-type display device 1000 having improved display quality such as pixel unevenness can be provided.

Note that, a light source used in the polarized light illumination device 1100 is not limited to a white light source such as an extra-high pressure mercury lamp and a halogen lamp, and may be configured such that an LED light source or a laser light source that provides monochromatic light corresponding to blue light, green light, or red light is arranged, corresponding to each of the liquid crystal light valves 1210, 1220, and 1230 on which the color light is incident.

Note that, the liquid crystal apparatus 100 may be mounted in, in addition to the projection-type display device 1000, various electronic apparatuses such as an Electrical View Finder (EVF), a mobile miniprojector, a head-up display, a smart phone, a mobile phone, a mobile computer, a digital camera, a digital video camera, a display, an on-board device, an audio device, an exposure device, and a lighting device.

Modification 1

A liquid crystal apparatus as an electro-optical device according to the present modification is provided with a second base insulating layer including an HTO film instead of the light absorption layer 211b in the element substrate 210 of Exemplary Embodiment 3. A thickness of the second base insulating layer is not particularly limited, but is approximately 50 nm, for example. Accordingly, effects similar to those of Exemplary Embodiment 2 can be obtained.

Contents derived from the exemplary embodiments will be described below.

An electro-optical device includes a substrate, a transistor, a scanning line in a layer between a semiconductor layer of the transistor and the substrate, the scanning line having a light shielding property, and, in a plan view from a normal line direction on one surface of the substrate, a light shielding layer disposed between the scanning line and an adjacent scanning line adjacent to the scanning line so as to overlap each of an end portion of the scanning line and an end portion of the adjacent scanning line.

According to this configuration, a light shielding property for the semiconductor layer of the transistor can be improved. Specifically, in addition to the scanning line having a light shielding property, the light shielding layer is provided that overlaps each of the end portion of the one scanning line and the end portion of the adjacent scanning line. Thus, diffracted light propagating from a gap between the end portion of the scanning line and the end portion of the adjacent scanning line to the semiconductor layer is reduced. Thus, it is possible to suppress a roundabout of light to the semiconductor layer for light incident from a side of the substrate on which the semiconductor layer is provided, compared to the case in the past. As described above, an electro-optical device having an improved light shielding property for a semiconductor layer of a transistor can be provided.

The above electro-optical device preferably includes an interlayer insulating layer in a layer between a light shielding layer and a scanning line.

According to this configuration, a short circuit between the light shielding layer and the scanning line can be prevented by the interlayer insulating layer.

The above electro-optical device preferably includes a light absorption layer in a layer between a light shielding layer and an interlayer insulating layer.

According to this configuration, diffracted light propagating from between the light shielding layer and the scanning line to the semiconductor layer is absorbed by the light absorption layer and attenuated. Thus, a light shielding property for the semiconductor layer can be further improved.

In the electro-optical device described above, a light absorption layer preferably includes a forming material having a refractive index of from 1.5 to 4.0 and an extinction coefficient of from 0.0 to 2.0 relative to light having a wavelength of 550 nm.

According to this configuration, reflectance of incident light is reduced, and an absorption rate of incident light can be improved. In other words, diffracted light incident on a semiconductor layer is further reduced.

In the electro-optical device described above, a light shielding layer preferably does not overlap a channel area and an LDD area of the semiconductor layer, in plan view from a normal line direction on one surface of a substrate.

According to this configuration, the light shielding layer does not extend up to the channel area and the LDD area of the semiconductor layer, so uneven steps derived from the light shielding layer do not occur in the channel area and the LDD area. When the uneven steps occur in the channel area and the LDD area, dimensional variations are likely to occur when patterning and forming the semiconductor layer, and affect diode junction leakage variations. In other words, since the above uneven steps do not occur, the dimensional variations in the semiconductor layer are less likely to occur, and the diode junction leakage variations can be suppressed.

In the electro-optical device described above, it is preferable that a recessed portion provided on one surface of a substrate be included, a recessed portion be provided in a gap between the scanning line and another scanning line adjacent to each other in plan view from a normal line direction on one surface of a substrate, and at least a part of a light shielding layer be provided within a recessed portion.

According to this configuration, part of a light shielding layer is provided in the recessed portion so as to be inserted into the substrate. In other words, the light shielding layer in the recessed portion is provided downward with respect to the one surface of the substrate. Thus, diffracted light is unlikely to propagate through a gap between the light shielding layer and the scanning line, and a light shielding property for the semiconductor layer can be further improved.

In the electro-optical device described above, a height from a bottom surface of a recessed portion to one surface of a substrate is preferably greater than a thickness of a light shielding layer.

According to this configuration, part of the light shielding layer is provided so as to be further inserted into the substrate. Thus, a light shielding property for the semiconductor layer can be further improved.

In the electro-optical device described above, it is preferable that a recessed portion provided on one surface of a substrate be included, and a height from a bottom surface of a recessed portion to one surface of a substrate be greater than a total value of a thickness of a light absorption layer and a thickness of an interlayer insulating layer.

According to this configuration, even when an interlayer insulating layer is provided between a light shielding layer and the substrate in the recessed portion, the light shielding layer is provided, in a normal line direction on the one surface of the substrate, at a position closer to another surface of the substrate than a scanning line. Thus, a light shielding property for the semiconductor layer can be further improved.

An electronic apparatus includes the electro-optical device described above.

According to this configuration, an electronic apparatus can be provided that includes an electro-optical device having an improved light shielding property for a semiconductor layer and reduced off-leakage current in a transistor, and that has improved display quality such as pixel unevenness.

What is claimed is:

1. An electro-optical device, comprising:
   a substrate;
   a transistor;
   a scanning line disposed in a layer between a semiconductor layer of the transistor and the substrate, the scanning line having a light shielding property;
   a light shielding layer disposed between the scanning line and an adjacent scanning line adjacent to the scanning line to overlap each of an end portion of the scanning line and an end portion of the adjacent scanning line, in plan view from a normal line direction on one surface of the substrate, the light shielding layer being disposed between the semiconductor layer and the substrate in a thickness direction of the substrate;
   an interlayer insulating layer in a layer between the light shielding layer and the scanning line; and
   a light absorption layer in a layer between the light shielding layer and the interlayer insulating layer,
   wherein the light absorption layer includes a forming material having a refractive index of from 1.5 to 4.0 and an extinction coefficient of from 0.0 to 2.0 relative to light having a wavelength of 550 nm.

2. The electro-optical device according to claim 1, wherein the light shielding layer does not overlap a channel area and an LDD area of the semiconductor layer, in plan view from a normal line direction on the one surface of the substrate.

3. The electro-optical device according to claim 1, comprising a recessed portion provided on the one surface of the substrate, wherein
   the recessed portion is provided in a gap between the scanning line and another scanning line adjacent to each other, in plan view from a normal line direction on the one surface of the substrate, and
   at least a part of the light shielding layer is provided within the recessed portion.

4. The electro-optical device according to claim 3, wherein a height from a bottom surface of the recessed portion to the one surface of the substrate is greater than a thickness of the light shielding layer.

5. The electro-optical device according to claim 1, comprising a recessed portion provided on the one surface of the substrate, wherein
   a height from a bottom surface of the recessed portion to the one surface of the substrate is greater than a total value of a thickness of the light absorption layer and a thickness of the interlayer insulating layer.

6. An electronic apparatus, comprising the electro-optical device according to claim 1.

7. The electro-optical device according to claim 1, wherein
   the light shielding layer has an island shape and overlaps with an edge of the scanning line.

8. An electro-optical device, comprising:
   a substrate;
   a transistor;
   a scanning line disposed in a layer between a semiconductor layer of the transistor and the substrate, the scanning line having a light shielding property; and
   a light shielding layer disposed between the scanning line and an adjacent scanning line adjacent to the scanning line to overlap each of an end portion of the scanning line and an end portion of the adjacent scanning line, in plan view from a normal line direction on one surface of the substrate, wherein the light shielding layer does not overlap a channel area and an LDD area of the semiconductor layer, in plan view from a normal line direction on the one surface of the substrate.

9. An electro-optical device, comprising:
a substrate;
a transistor;
a scanning line disposed in a layer between a semiconductor layer of the transistor and the substrate, the scanning line having a light shielding property;
a light shielding layer disposed between the scanning line and an adjacent scanning line adjacent to the scanning line to overlap each of an end portion of the scanning line and an end portion of the adjacent scanning line, in plan view from a normal line direction on one surface of the substrate; and
a recessed portion provided on the one surface of the substrate, wherein
the recessed portion is provided in a gap between the scanning line and another scanning line adjacent to each other, in plan view from a normal line direction on the one surface of the substrate, and
at least a part of the light shielding layer is provided within the recessed portion.

10. An electro-optical device, comprising:
a substrate;
a transistor;
a scanning line disposed in a layer between a semiconductor layer of the transistor and the substrate, the scanning line having a light shielding property;
a light shielding layer disposed between the scanning line and an adjacent scanning line adjacent to the scanning line to overlap each of an end portion of the scanning line and an end portion of the adjacent scanning line, in plan view from a normal line direction on one surface of the substrate;
an interlayer insulating layer in a layer between the light shielding layer and the scanning line;
a light absorption layer in a layer between the light shielding layer and the interlayer insulating layer; and
a recessed portion provided on the one surface of the substrate, wherein
a height from a bottom surface of the recessed portion to the one surface of the substrate is greater than a total value of a thickness of the light absorption layer and a thickness of the interlayer insulating layer.

* * * * *